(12) United States Patent
Chen et al.

(10) Patent No.: US 12,224,327 B2
(45) Date of Patent: Feb. 11, 2025

(54) SEMICONDUCTOR DEVICE AND METHOD

(71) Applicant: Taiwan Semiconductor Manufacturing Co., Ltd., Hsinchu (TW)

(72) Inventors: Kuo-Ju Chen, Taichung (TW);
Shih-Hsiang Chiu, New Taipei (TW);
Su-Hao Liu, Jhongpu Township (TW);
Liang-Yin Chen, Hsinchu (TW);
Huicheng Chang, Tainan (TW);
Yee-Chia Yeo, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 18/366,369

(22) Filed: Aug. 7, 2023

(65) Prior Publication Data
US 2023/0411474 A1    Dec. 21, 2023

Related U.S. Application Data

(62) Division of application No. 17/223,293, filed on Apr. 6, 2021, now Pat. No. 11,862,694.
(Continued)

(51) Int. Cl.
*H01L 29/417*    (2006.01)
*H01L 21/285*    (2006.01)
(Continued)

(52) U.S. Cl.
CPC .. *H01L 29/41791* (2013.01); *H01L 21/28568* (2013.01); *H01L 21/31111* (2013.01);
(Continued)

(58) Field of Classification Search
CPC ....... H01L 29/41791; H01L 21/823821; H01L 27/0924; H01L 29/66795; H01L 29/7851;
(Continued)

(56) References Cited

U.S. PATENT DOCUMENTS 5,915,191 A    6/1999    Jun
9,105,490 B2   8/2015    Wang et al.
(Continued)

FOREIGN PATENT DOCUMENTS

KR    20190062132 A    6/2019
TW      201924062 A    6/2019
(Continued)

*Primary Examiner* — Bac H Au
(74) *Attorney, Agent, or Firm* — Slater Matsil, LLP

(57) ABSTRACT

Methods for improving sealing between contact plugs and adjacent dielectric layers and semiconductor devices formed by the same are disclosed. In an embodiment, a semiconductor device includes a first dielectric layer over a conductive feature, a first portion of the first dielectric layer including a first dopant; a metal feature electrically coupled to the conductive feature, the metal feature including a first contact material in contact with the conductive feature; a second contact material over the first contact material, the second contact material including a material different from the first contact material, a first portion of the second contact material further including the first dopant; and a dielectric liner between the first dielectric layer and the metal feature, a first portion of the dielectric liner including the first dopant.

20 Claims, 34 Drawing Sheets

Related U.S. Application Data

(60) Provisional application No. 63/082,045, filed on Sep. 23, 2020.

(51) Int. Cl.
| | | |
|---|---|---|
| *H01L 21/311* | (2006.01) | |
| *H01L 21/3115* | (2006.01) | |
| *H01L 21/8238* | (2006.01) | |
| *H01L 27/092* | (2006.01) | |
| *H01L 29/40* | (2006.01) | |
| *H01L 29/45* | (2006.01) | |
| *H01L 29/66* | (2006.01) | |
| *H01L 29/78* | (2006.01) | |

(52) U.S. Cl.
CPC .............. *H01L 21/31155* (2013.01); *H01L 21/823821* (2013.01); *H01L 21/823871* (2013.01); *H01L 27/0924* (2013.01); *H01L 29/401* (2013.01); *H01L 29/45* (2013.01); *H01L 29/66795* (2013.01); *H01L 29/7851* (2013.01)

(58) Field of Classification Search
CPC ........... H01L 21/76831; H01L 21/7684; H01L 21/76859; H01L 21/3215; H01L 21/76883; H01L 21/76877; H01L 21/76886; H01L 21/823475; H01L 21/823871; H01L 21/76825
See application file for complete search history.

(56) References Cited

U.S. PATENT DOCUMENTS

| | | |
|---|---|---|
| 9,236,267 B2 | 1/2016 | De et al. |
| 9,236,300 B2 | 1/2016 | Liaw |
| 9,406,804 B2 | 8/2016 | Huang et al. |
| 9,443,769 B2 | 9/2016 | Wang et al. |
| 9,520,482 B1 | 12/2016 | Chang et al. |
| 9,548,366 B1 | 1/2017 | Ho et al. |
| 9,576,814 B2 | 2/2017 | Wu et al. |
| 9,831,183 B2 | 11/2017 | Lin et al. |
| 9,859,386 B2 | 1/2018 | Ho et al. |
| 2007/0158763 A1 | 7/2007 | Anderson et al. |
| 2016/0155701 A1 | 6/2016 | Mignot et al. |
| 2017/0110576 A1 | 4/2017 | Kim et al. |
| 2018/0151679 A1 | 5/2018 | Wang et al. |
| 2019/0131399 A1 | 5/2019 | Liu et al. |
| 2019/0157148 A1 | 5/2019 | Hsieh et al. |
| 2019/0305107 A1 | 10/2019 | Chen et al. |
| 2019/0334008 A1 | 10/2019 | Chen et al. |
| 2020/0020567 A1 | 1/2020 | Sun et al. |
| 2020/0044025 A1 | 2/2020 | Liu et al. |
| 2020/0058790 A1 | 2/2020 | Chiang et al. |
| 2020/0105939 A1 | 4/2020 | Kao et al. |
| 2020/0135641 A1 | 4/2020 | Lee et al. |
| 2021/0066500 A1 | 3/2021 | Liu et al. |
| 2021/0083114 A1 | 3/2021 | Wang et al. |
| 2021/0320180 A1 | 10/2021 | Chen et al. |
| 2022/0359755 A1 | 11/2022 | Liu et al. |

FOREIGN PATENT DOCUMENTS

| | | |
|---|---|---|
| TW | 201942977 A | 11/2019 |
| TW | 202036911 A | 10/2020 |

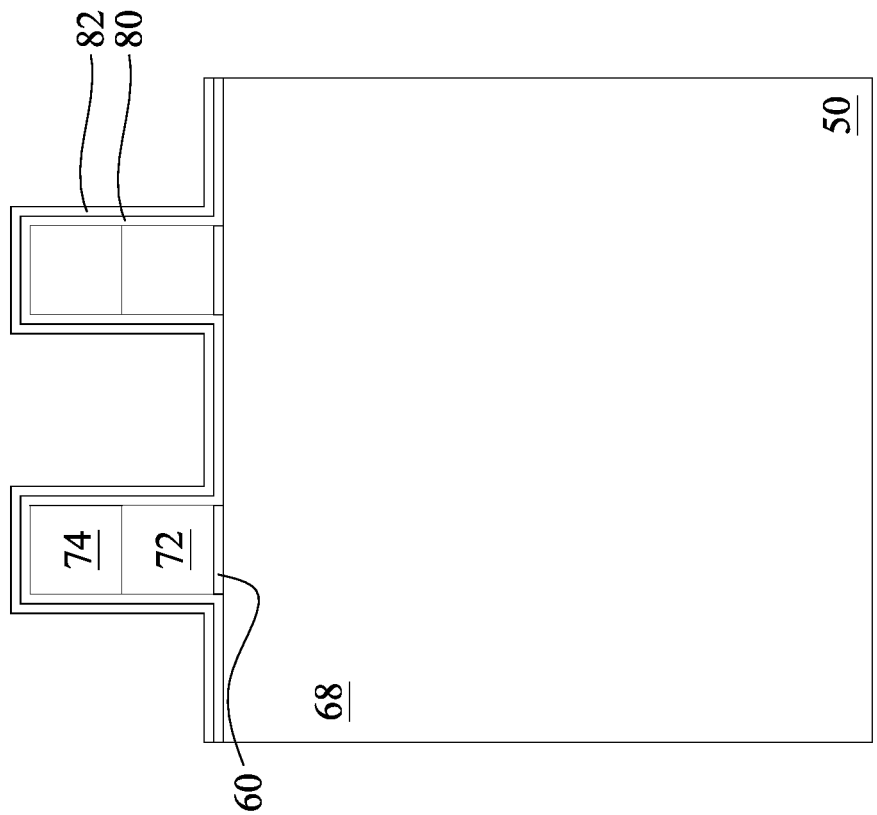
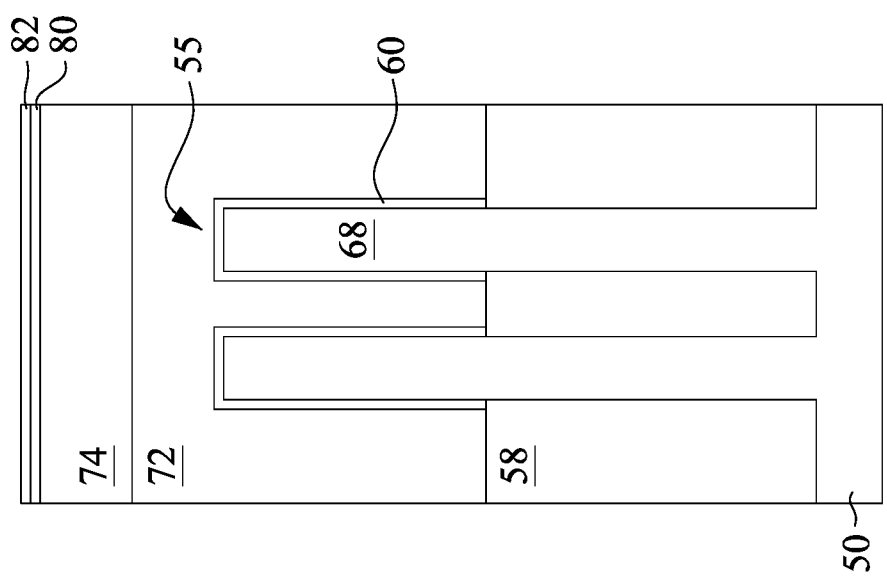
Fig. 7B
Fig. 7A

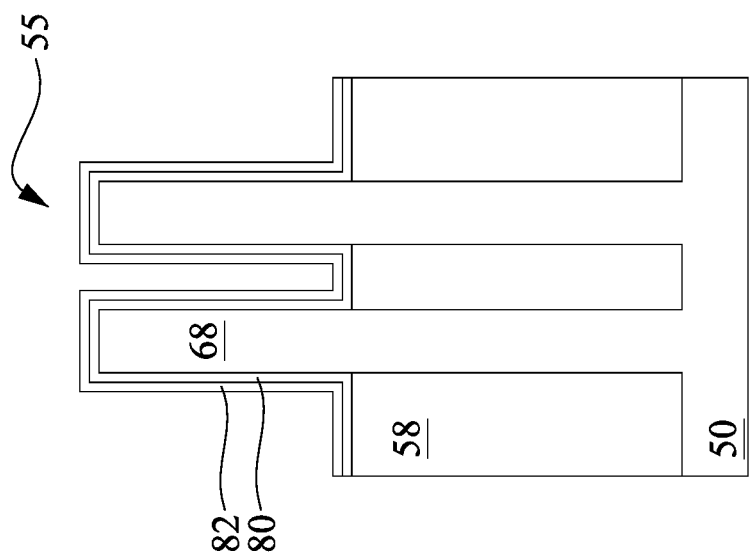

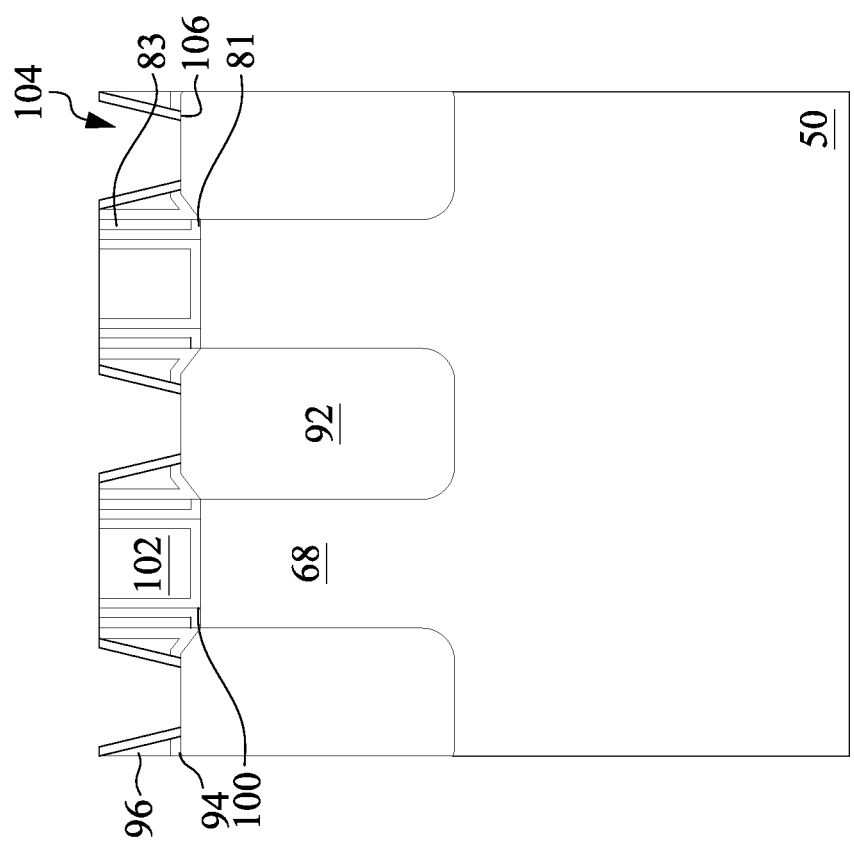
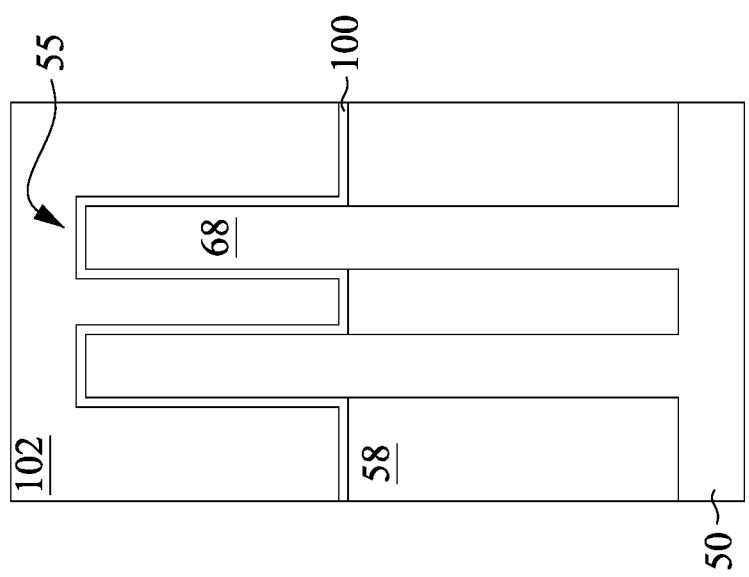
Fig. 16B
Fig. 16A

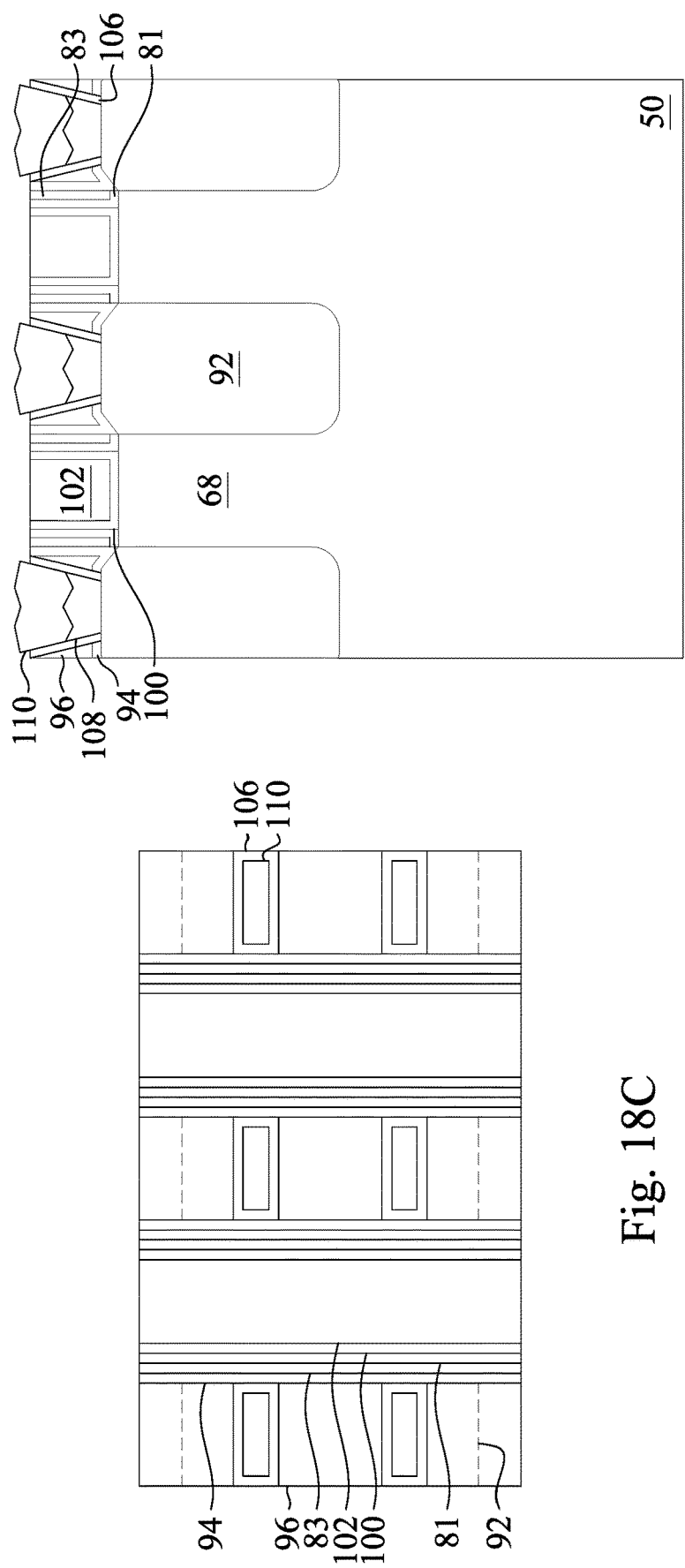

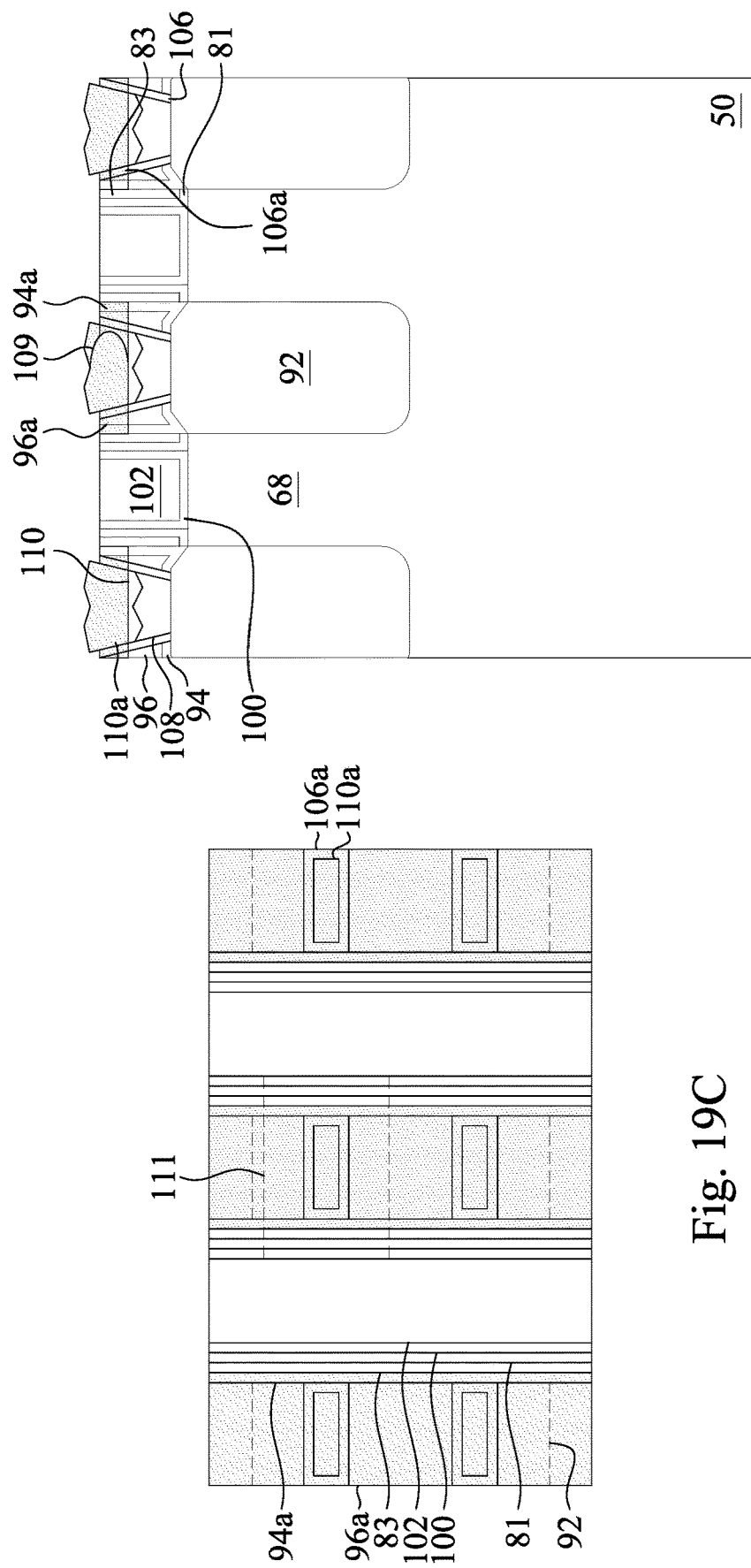

SEMICONDUCTOR DEVICE AND METHOD

PRIORITY CLAIM AND CROSS-REFERENCE

This application is a divisional of U.S. patent application Ser. No. 17/223,293, filed on Apr. 6, 2021, now U.S. Pat. No. 11,862,694, issued Jan. 2, 2024, which claims the benefit of U.S. Provisional Application No. 63/082,045, filed on Sep. 23, 2020, each application is hereby incorporated herein by reference.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2, 3, 4, 5, 6A, 6B, 7A, 7B, 7C, 8A, 8B, 8C, 9A, 9B, 9C, 10A, 10B, 10C, 10D, 11A, 11B, 12A, 12B, 13A, 13B, 14A, 14B, 14C, 15A, 15B, 15C, 16A, 16B, 16C, 17A, 17B, 17C, 18A, 18B, 18C, 18D, 19A, 19B, 19C, 19D, 19E, 19F, 20A, 20B, 20C, 20D, 21A, 21B, 22A, and 22B are cross-sectional views of intermediate stages in the manufacturing of semiconductor devices, in accordance with some embodiments.

DETAILED DESCRIPTION

Figure 1:
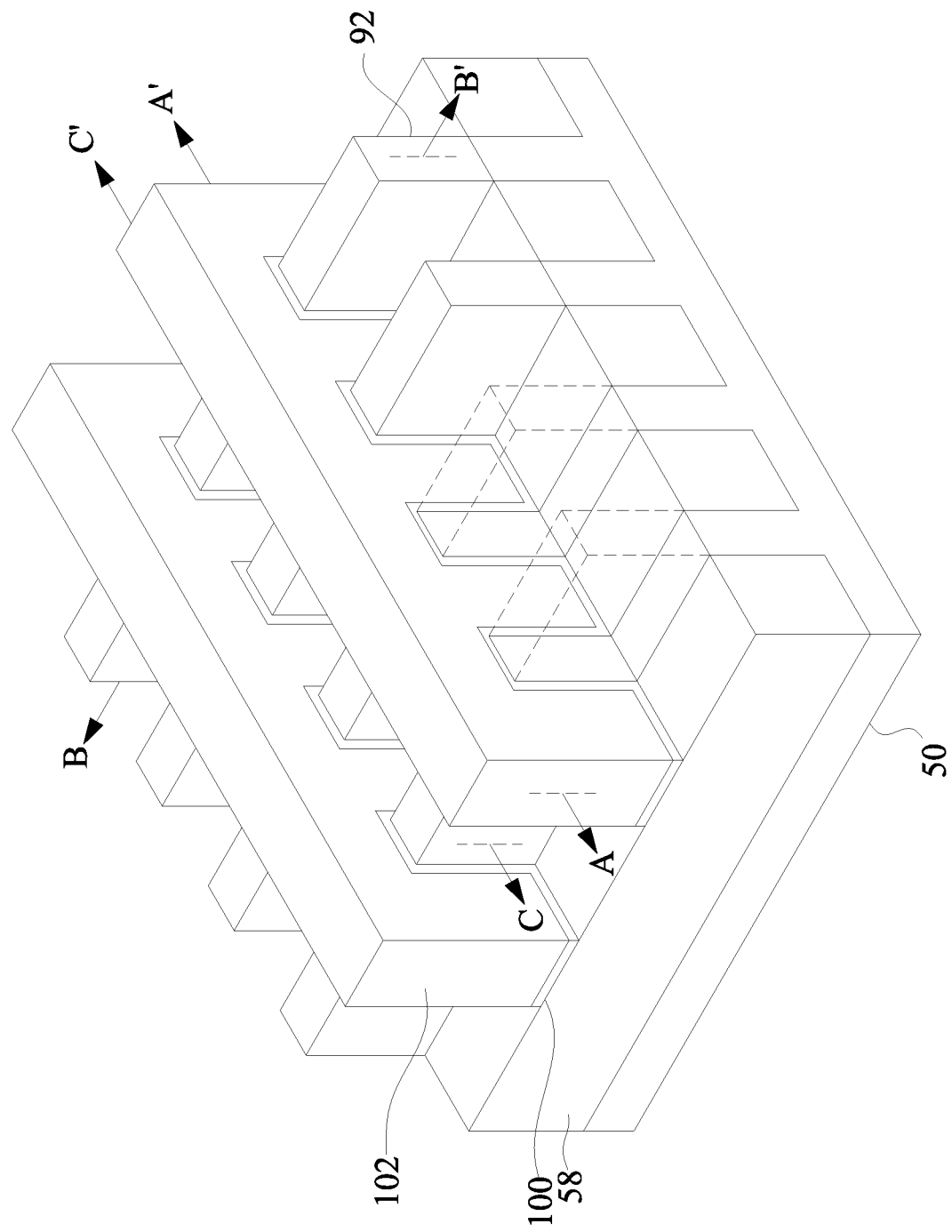
FIG. 1 illustrates an example of a semiconductor device including fin field-effect transistors (FinFETs) in a three-dimensional view, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Various embodiments provide a method for improving interfaces between dielectric layers and contacts and semiconductor devices formed by said methods. The method includes forming an opening in a dielectric layer, depositing a first contact material in the opening, depositing a second contact material over the first contact material to form the contact, and performing an ion implantation process on the dielectric layer. The dielectric layer may include silicon oxide, silicon nitride, or the like; the first contact material may include cobalt or the like; and the second contact material may include tungsten, ruthenium, or the like. Ions implanted by the ion implantation process may include germanium, xenon, argon, silicon, arsenic, nitrogen, combinations thereof, or the like. Implanting the ions into the dielectric layer may cause the volume of the dielectric layer to expand, which forms a seal between the dielectric layer and the second contact material. A planarization process such as a chemical mechanical polish (CMP) planarizes the dielectric layer and the second contact material. The seal prevents chemicals used in the planarization process, such as CMP slurry, from penetrating between the second contact material and the dielectric layer and removing material of the first contact material. This reduces crack formation between the contact and the dielectric layer, reduces device defects and improves device performance.

FIG. 1 illustrates an example of FinFETs, in accordance with some embodiments. The FinFETs comprise fins 55 on a substrate 50 (e.g., a semiconductor substrate). Shallow trench isolation (STI) regions 58 are disposed in the substrate 50 and the fins 55 protrude above and from between neighboring STI regions 58. Although the STI regions 58 are described/illustrated as being separate from the substrate 50, as used herein the term "substrate" may be used to refer to just the semiconductor substrate or a semiconductor substrate inclusive of STI regions. Additionally, although the fins 55 are illustrated as single, continuous materials with the substrate 50, the fins 55 and/or the substrate 50 may comprise a single material or a plurality of materials. In this context, the fins 55 refer to the portions extending between the neighboring STI regions 58.

Gate dielectric layers 100 are along sidewalls and over a top surface of the fins 55, and gate electrodes 102 are over the gate dielectric layers 100. Epitaxial source/drain regions 92 are disposed on opposite sides of the fins 55, the gate dielectric layers 100, and the gate electrodes 102. FIG. 1 further illustrates reference cross-sections that are used in later figures. Cross-section A-A' is along a longitudinal axis of a gate electrode 102 and in a direction, for example, perpendicular to the direction of current flow between the epitaxial source/drain regions 92 of the FinFETs. Cross-section B-B' is perpendicular to cross-section A-A' and is along a longitudinal axis of a fin 55 and in a direction of, for example, the current flow between the epitaxial source/drain regions 92 of the FinFETs. Cross-section C-C' is parallel to cross-section A-A' and extends through the epitaxial source/drain regions 92 of the FinFETs. Subsequent figures refer to these reference cross-sections for clarity.

Some embodiments discussed herein are discussed in the context of fin field effect transistors (FinFETs) formed using gate-last processes. In some embodiments, a gate-first process may be used. Also, some embodiments contemplate aspects used in planar devices (e.g., planar field effect transistors), nanostructure (e.g., nanosheet, nanowire, gate-all-around, or the like) field effect transistors (NSFETs), or the like.

FIGS. 2 through 22B are cross-sectional views of intermediate stages in the manufacturing of FinFETs, in accordance with some embodiments. FIGS. 2 through 5, 6A, 7A, 8A, 9A, 10A, 11A, 12A, 13A, 14A, 15A, 16A, 17A, 18A, 19A, 20A, 21A, and 22A are illustrated along reference cross-section A-A' illustrated in FIG. 1. FIGS. 6B, 7B, 8B, 9B, 10B, 11B, 12B, 13B, 14B, 14C, 15B, 16B, 17B, 18B, 18D, 19B, 19D, 20B, 20D, 21B, and 22B are illustrated along a similar cross-section B-B' illustrated in FIG. 1. FIGS. 7C, 8C, 9C, 10C, and 10D are illustrated along reference cross-section C-C' illustrated in FIG. 1. FIGS. 15C, 16C, 17C, 18C, 19C, 19E, 19F, and 20C are top-down views.

Figure 2:
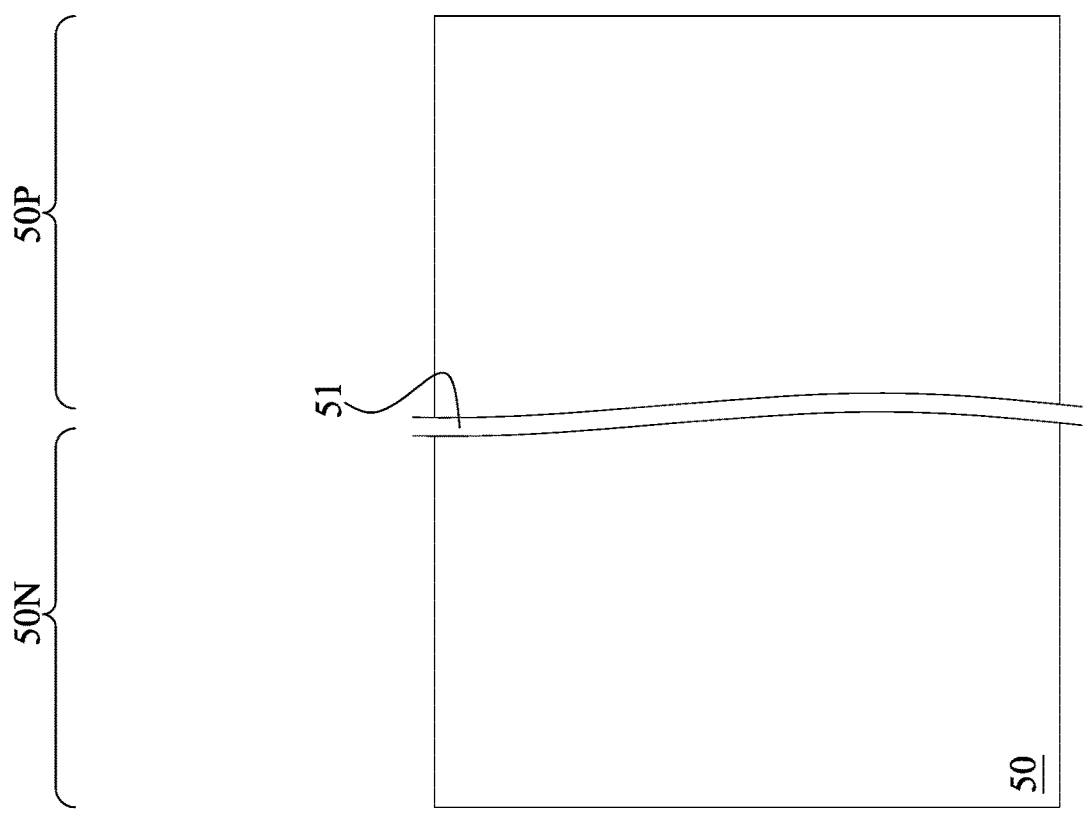

In FIG. 2, a substrate 50 is provided. The substrate 50 may be a semiconductor substrate, such as a bulk semiconductor, a semiconductor-on-insulator (SOI) substrate, or the like, which may be doped (e.g., with a p-type or an n-type dopant) or undoped. The substrate 50 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 50 may include silicon; germanium; a compound semiconductor including silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof.

The substrate 50 has a region 50N and a region 50P. The region 50N can be for forming n-type devices, such as NMOS transistors, e.g., n-type FinFETs. The region 50P can be for forming p-type devices, such as PMOS transistors, e.g., p-type FinFETs. The region 50N may be physically separated from the region 50P (as illustrated by divider 51), and any number of device features (e.g., other active devices, doped regions, isolation structures, etc.) may be disposed between the region 50N and the region 50P.

Figure 3:
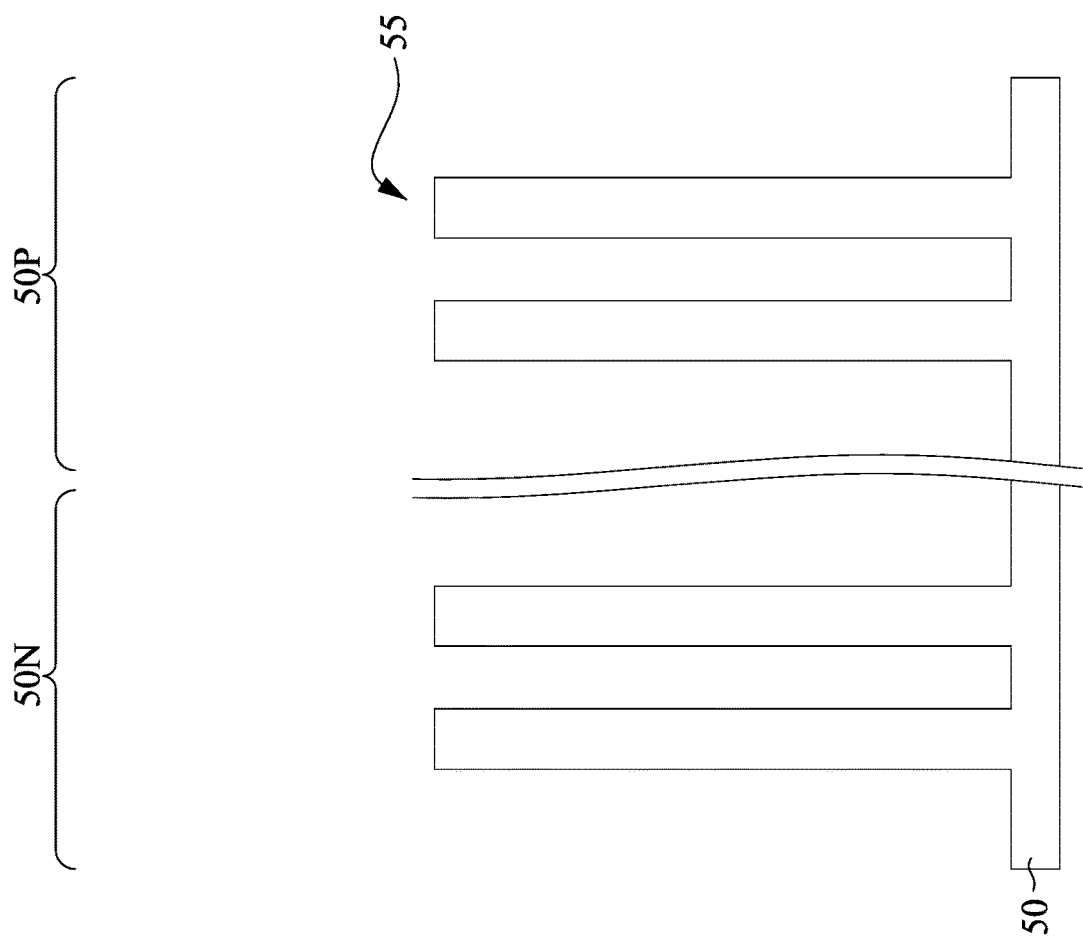

In FIG. 3, fins 55 are formed in the substrate 50. The fins 55 are semiconductor strips. In some embodiments, the fins 55 may be formed in the substrate 50 by etching trenches in the substrate 50. The etching may be any acceptable etch process, such as a reactive ion etch (RIE), a neutral beam etch (NBE), the like, or a combination thereof. The etch may be anisotropic.

The fins 55 may be patterned by any suitable method. For example, the fins 55 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in some embodiments, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins 55. In some embodiments, the mask (or other layer) may remain on the fins 55.

Figure 4:
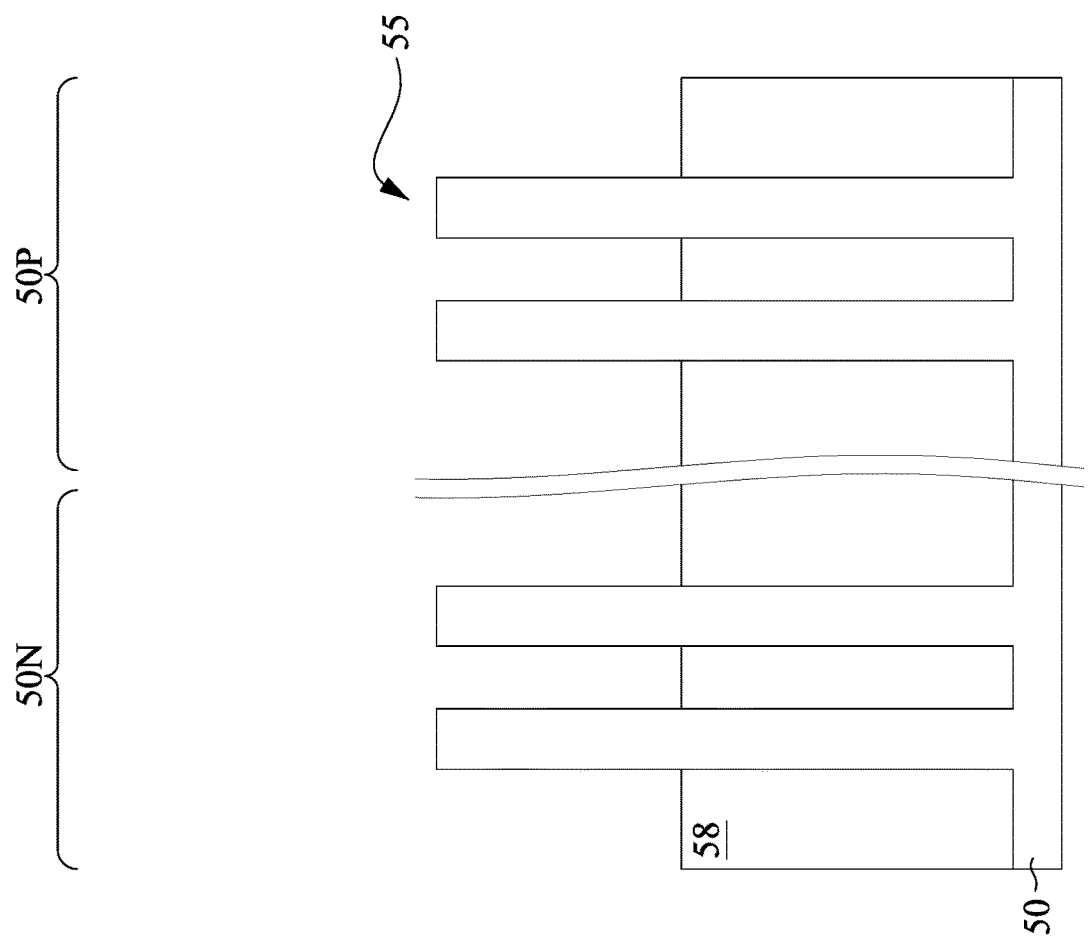

In FIG. 4, shallow trench isolation (STI) regions 58 are formed adjacent the fins 55. The STI regions 58 may be formed by forming an insulation material (not separately illustrated) over the substrate 50 and between neighboring fins 55. The insulation material may be an oxide, such as silicon oxide, a nitride, the like, or a combination thereof, and may be formed by a high density plasma chemical vapor deposition (HDP-CVD), a flowable CVD (FCVD) (e.g., a CVD-based material deposition in a remote plasma system with post curing to convert the deposited material to another material, such as an oxide), the like, or a combination thereof. Other insulation materials formed by any acceptable process may be used. In the illustrated embodiment, the insulation material is silicon oxide formed by an FCVD process. An anneal process may be performed once the insulation material is formed. In some embodiments, the insulation material is formed such that excess insulation material covers the fins 55. The insulation material may comprise a single layer or may utilize multiple layers. For example, in some embodiments a liner (not separately illustrated) may first be formed along surfaces of the substrate 50 and the fins 55. Thereafter, a fill material, such as those discussed above may be formed over the liner.

A removal process is then applied to the insulation material to remove excess insulation material over the fins 55. In some embodiments, a planarization process such as a chemical mechanical polish (CMP), an etch-back process, combinations thereof, or the like may be utilized. The planarization process may planarize the insulation material and the fins 55. The planarization process exposes the fins 55 such that top surfaces of the fins 55 and the insulation material are level after the planarization process is complete.

The insulation material is then recessed to form the STI regions 58 as illustrated in FIG. 4. The insulation material is recessed such that upper portions of the fins 55 and the substrate 50 protrude from between neighboring STI regions 58. Further, the top surfaces of the STI regions 58 may have flat surfaces as illustrated, convex surfaces, concave surfaces (such as dishing), or a combination thereof. The top surfaces of the STI regions 58 may be formed flat, convex, and/or concave by an appropriate etch. The STI regions 58 may be recessed using an acceptable etching process, such as one that is selective to the material of the insulation material (e.g., etches the material of the insulation material at a faster rate than the material of the fins 55 and the substrate 50). For example, an oxide removal using, for example, dilute hydrofluoric (dHF) acid may be used.

The process described with respect to FIGS. 2-4 is just one example of how the fins 55 may be formed. In some embodiments, the fins 55 may be formed by an epitaxial growth process. For example, a dielectric layer can be formed over a top surface of the substrate 50, and trenches can be etched through the dielectric layer to expose the underlying substrate 50. Homoepitaxial structures can be epitaxially grown in the trenches, and the dielectric layer can be recessed such that the homoepitaxial structures protrude from the dielectric layer to form fins. Additionally, in some embodiments, heteroepitaxial structures can be used for the fins 55. For example, the fins 55 in FIG. 4 can be recessed, and a material different from the fins 55 may be epitaxially grown over the recessed fins 55. In such embodiments, the fins 55 comprise the recessed material as well as the epitaxially grown material disposed over the recessed material. In some embodiments, a dielectric layer can be formed over a top surface of the substrate 50, and trenches can be etched through the dielectric layer. Heteroepitaxial structures can then be epitaxially grown in the trenches using a material different from the substrate 50, and the dielectric layer can be recessed such that the heteroepitaxial structures protrude from the dielectric layer to form the fins 55. In some embodiments where homoepitaxial or heteroepitaxial structures are epitaxially grown, the epitaxially grown materials may be in situ doped during growth, which may obviate prior and subsequent implantations although in situ and implantation doping may be used together.

Still further, it may be advantageous to epitaxially grow a material in region 50N (e.g., an NMOS region) different from the material in region 50P (e.g., a PMOS region). In some embodiments, upper portions of the fins 55 may be formed from silicon-germanium ($Si_xGe_{1-x}$, where x can be in the range of 0 to 1), silicon carbide, pure or substantially pure germanium, a III-V compound semiconductor, a II-VI compound semiconductor, or the like. For example, the available materials for forming III-V compound semiconductor include, but are not limited to, indium arsenide, aluminum arsenide, gallium arsenide, indium phosphide, gallium nitride, indium gallium arsenide, indium aluminum arsenide, gallium antimonide, aluminum antimonide, aluminum phosphide, gallium phosphide, and the like.

Further in FIG. 4, appropriate wells (not separately illustrated) may be formed in the fins 55 and/or the substrate 50. In some embodiments, a P well may be formed in the region 50N, and an N well may be formed in the region 50P. In some embodiments, a P well or an N well are formed in both the region 50N and the region 50P.

In the embodiments with different well types, the different implant steps for the region 50N and the region 50P may be achieved using a photoresist or other masks (not separately illustrated). For example, a photoresist may be formed over the fins 55 and the STI regions 58 in the region 50N. The photoresist is patterned to expose the region 50P of the substrate 50, such as a PMOS region. The photoresist can be formed by using a spin-on technique and can be patterned using acceptable photolithography techniques. Once the photoresist is patterned, an n-type impurity implant is performed in the region 50P, and the photoresist may act as a mask to substantially prevent n-type impurities from being implanted into the region 50N, such as an NMOS region. The n-type impurities may be phosphorus, arsenic, antimony, or the like implanted in the region to a concentration of equal to or less than $1 \times 10^{18}$ atoms/cm$^3$, such as between about $1 \times 10^{16}$ atoms/cm$^3$ and about $1 \times 10^{18}$ atoms/cm$^3$. After the implant, the photoresist is removed, such as by an acceptable ashing process.

Following the implanting of the region 50P, a photoresist is formed over the fins 55 and the STI regions 58 in the region 50P. The photoresist is patterned to expose the region 50N of the substrate 50, such as the NMOS region. The photoresist can be formed by using a spin-on technique and can be patterned using acceptable photolithography techniques. Once the photoresist is patterned, a p-type impurity implant may be performed in the region 50N, and the photoresist may act as a mask to substantially prevent p-type impurities from being implanted into the region 50P, such as the PMOS region. The p-type impurities may be boron, boron fluoride, indium, or the like implanted in the region to a concentration of equal to or less than $1 \times 10^{18}$ atoms/cm$^3$, such as between about $1 \times 10^{16}$ atoms/cm$^3$ and about $1 \times 10^{11}$ atoms/cm$^3$. After the implant, the photoresist may be removed, such as by an acceptable ashing process.

After the implants of the region 50N and the region 50P, an anneal may be performed to repair implant damage and to activate the p-type and/or n-type impurities that were implanted. In some embodiments, the grown materials of epitaxial fins may be in situ doped during growth, which may obviate the implantations, although in situ and implantation doping may be used together.

Figure 5:
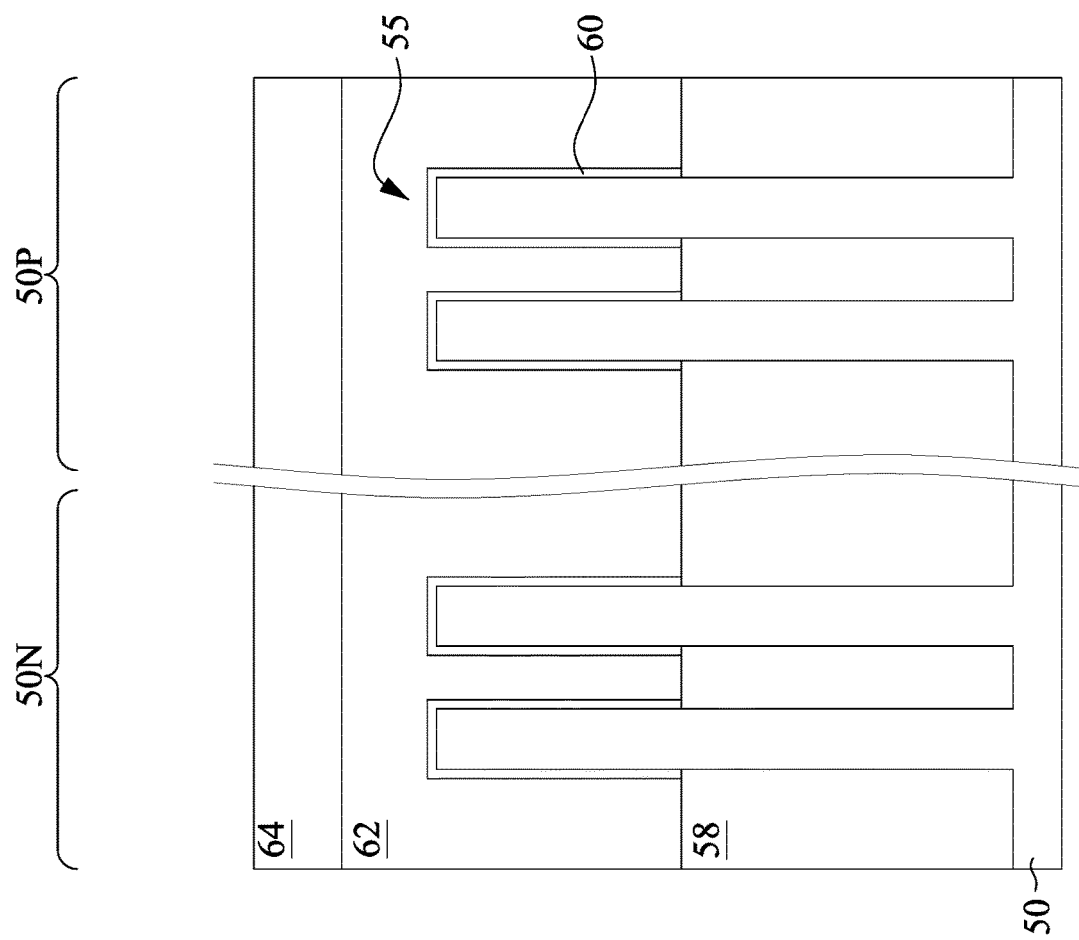

In FIG. 5, dummy dielectric layers 60 are formed on the fins 55 and the substrate 50. The dummy dielectric layers 60 may be, for example, silicon oxide, silicon nitride, a combination thereof, or the like, and may be deposited or thermally grown according to acceptable techniques. A dummy gate layer 62 is formed over the dummy dielectric layers 60, and a mask layer 64 is formed over the dummy gate layer 62. The dummy gate layer 62 may be deposited over the dummy dielectric layers 60 and then planarized by a process such as CMP. The mask layer 64 may be deposited over the dummy gate layer 62. The dummy gate layer 62 may be conductive or non-conductive materials and may be selected from a group including amorphous silicon, polycrystalline-silicon (polysilicon), polycrystalline silicon-germanium (poly-SiGe), metallic nitrides, metallic silicides, metallic oxides, and metals. The dummy gate layer 62 may be deposited by physical vapor deposition (PVD), CVD, sputter deposition, or other techniques known and used in the art for depositing the selected material. The dummy gate layer 62 may be made of other materials that have a high etching selectivity from the material of the STI regions 58. The mask layer 64 may include, for example, silicon nitride, silicon oxynitride, or the like. In this example, a single dummy gate layer 62 and a single mask layer 64 are formed across the region 50N and the region 50P. It is noted that the dummy dielectric layers 60 are shown covering only the fins 55 and the substrate 50 for illustrative purposes only. In some embodiments, the dummy dielectric layers 60 may be deposited such that the dummy dielectric layers 60 cover the STI regions 58, extending between the dummy gate layer 62 and the STI regions 58.

FIGS. 6A through 22B illustrate various additional steps in the manufacturing of embodiment devices. FIGS. 6A through 22B illustrate features in either of the region 50N or the region 50P. For example, the structures illustrated in FIGS. 6A through 22B may be applicable to both the region 50N and the region 50P. Differences (if any) in the structures of the region 50N and the region 50P are described in the text accompanying each figure.

Figure 6B:
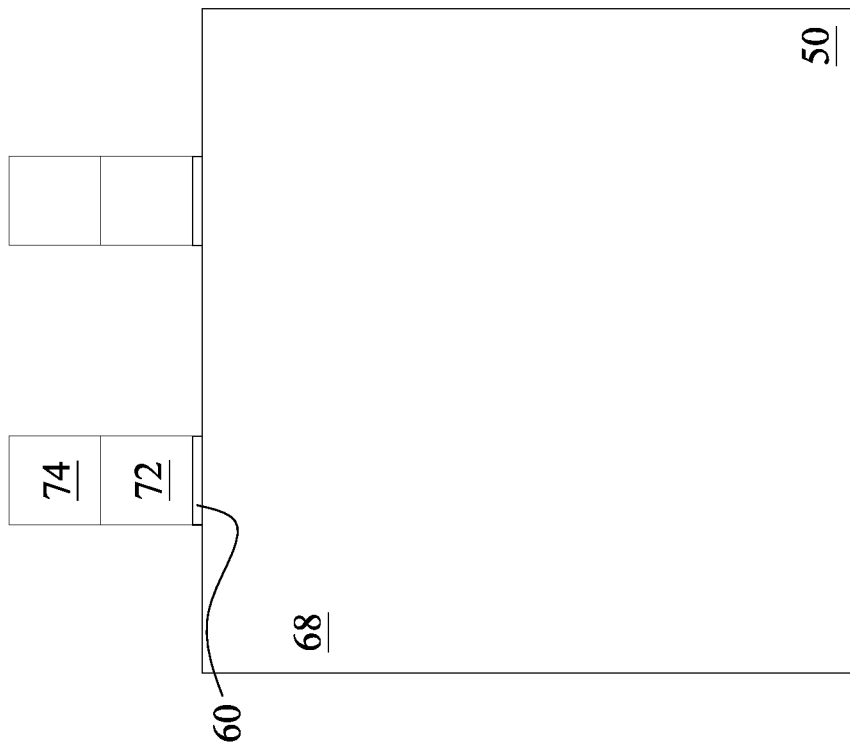
Figure 6A:
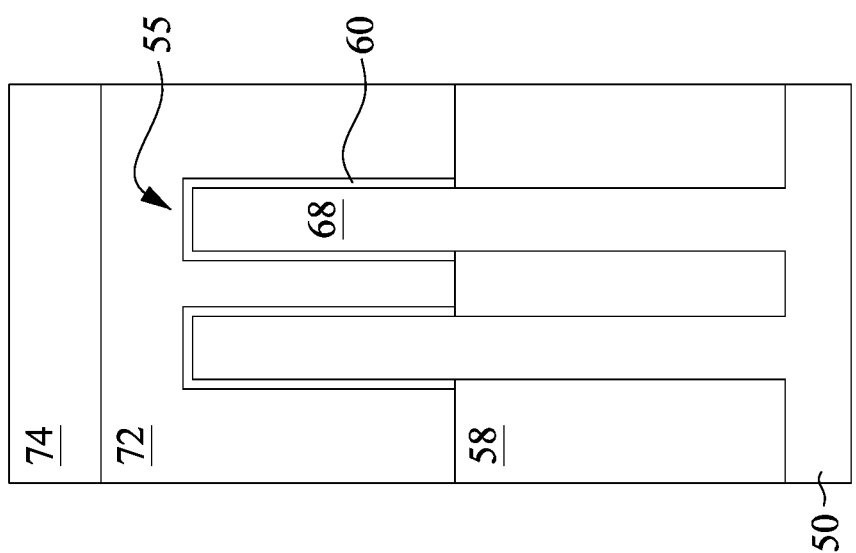

In FIGS. 6A and 6B, the mask layer 64 (see FIG. 5) may be patterned using acceptable photolithography and etching techniques to form masks 74. An acceptable etching technique may be used to transfer the pattern of the masks 74 to the dummy gate layer 62 to form dummy gates 72. In some embodiments, the pattern of the masks 74 may also be transferred to the dummy dielectric layers 60. The dummy gates 72 cover respective channel regions 68 of the fins 55. The pattern of the masks 74 may be used to physically separate each of the dummy gates 72 from adjacent dummy gates 72. The dummy gates 72 may also have a lengthwise direction substantially perpendicular to the lengthwise direction of respective fins 55. The dummy dielectric layers 60, the dummy gates 72, and the masks 74 may be collectively referred to as "dummy gate stacks."

In FIGS. 7A through 7C, a first spacer layer 80 and a second spacer layer 82 are formed over the structures illustrated in FIGS. 6A and 6B. In FIGS. 7A through 7C, the first spacer layer 80 is formed on top surfaces of the STI regions 58, top surfaces and sidewalls of the fins 55 and the masks 74, and sidewalls of the dummy gates 72 and the dummy dielectric layers 60. The second spacer layer 82 is deposited over the first spacer layer 80. The first spacer layer 80 may be formed by thermal oxidation or deposited by CVD, ALD, or the like. The first spacer layer 80 may be formed of silicon oxide, silicon nitride, silicon oxynitride, or the like. The second spacer layer 82 may be deposited by CVD, ALD, or the like. The second spacer layer 82 may be formed of silicon oxide, silicon nitride, silicon oxynitride, or the like.

Figure 8B:
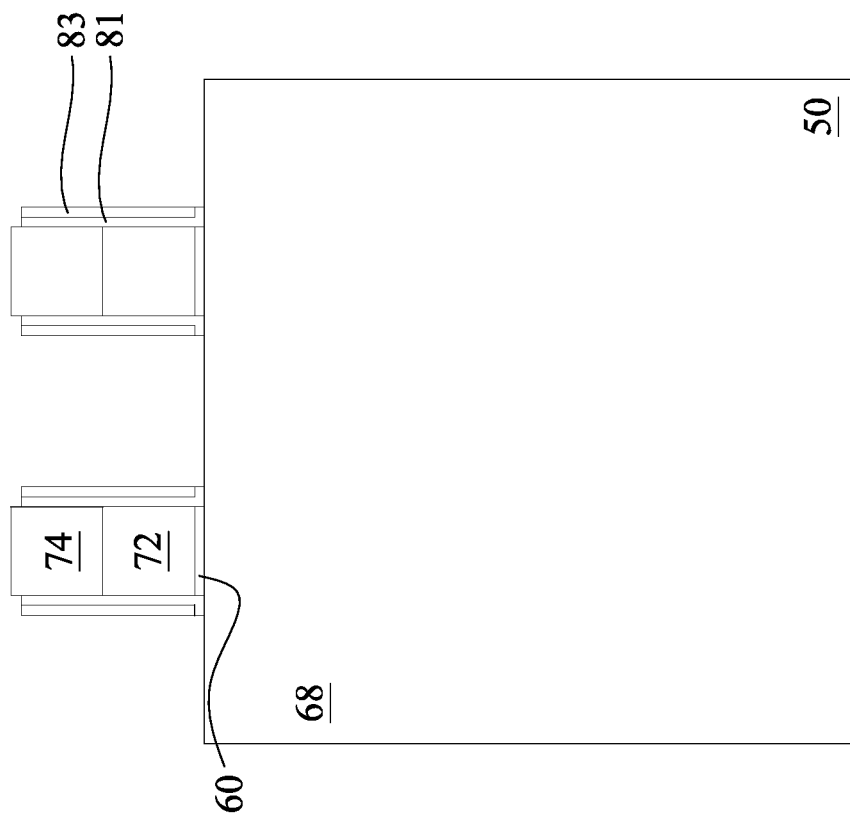
Figure 8A:
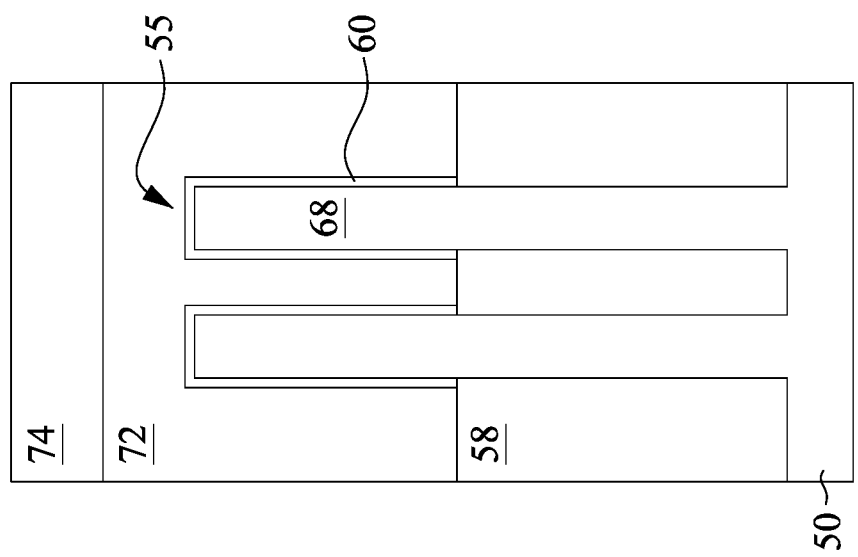
Figure 8C:
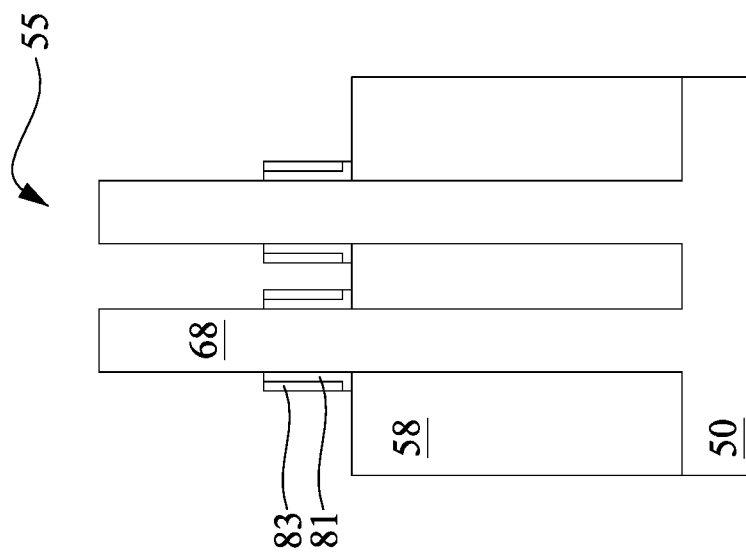

In FIGS. 8A through 8C, the first spacer layer 80 and the second spacer layer 82 are etched to form first spacers 81 and second spacers 83. The first spacer layer 80 and the second spacer layer 82 may be etched using a suitable etching process, such as an anisotropic etching process (e.g., a dry etching process) or the like. The first spacers 81 and the second spacers 83 may be disposed on sidewalls of the fins 55, the dummy dielectric layers 60, the dummy gates 72, and the masks 74. The first spacers 81 and the second spacers 83 may have different heights adjacent the fins 55 and the dummy gate stacks due to the etching processes used to etch the first spacer layer 80 and the second spacer layer 82, as well as different heights between the fins 55 and the dummy gate stacks. Specifically, as illustrated in FIGS. 8B and 8C, in some embodiments, the first spacers 81 and the second spacers 83 may extend partially up sidewalls of the fins 55 and the dummy gate stacks. In some embodiments, the first spacers 81 and the second spacers 83 may extend to top surfaces of the dummy gate stacks.

After the first spacers 81 and the second spacers 83 are formed, implants for lightly doped source/drain (LDD) regions (not separately illustrated) may be performed. In embodiments with different device types, similar to the implants discussed above in FIG. 4, a mask, such as a photoresist, may be formed over the region 50N, while exposing the region 50P, and appropriate type (e.g., p-type) impurities may be implanted into the exposed fins 55 and the substrate 50 in the region 50P. The mask may then be removed. Subsequently, a mask, such as a photoresist, may be formed over the region 50P while exposing the region 50N, and appropriate type impurities (e.g., n-type) may be implanted into the exposed fins 55 and the substrate 50 in the region 50N. The mask may then be removed. The n-type impurities may be the any of the n-type impurities previously discussed, and the p-type impurities may be the any of the p-type impurities previously discussed. The lightly doped source/drain regions may have a concentration of impurities of from about $1 \times 10^{15}$ atoms/cm$^3$ to about $1 \times 10^{19}$ atoms/cm$^3$. An anneal may be used to repair implant damage and to activate the implanted impurities.

It is noted that the above disclosure generally describes a process of forming spacers and LDD regions. Other processes and sequences may be used. For example, fewer or additional spacers may be utilized, different sequence of steps may be utilized (e.g., the first spacers 81 may be formed prior to forming the second spacers 83, additional spacers may be formed and removed, and/or the like). Furthermore, the n-type and p-type devices may be formed using a different structures and steps.

Figure 9B:
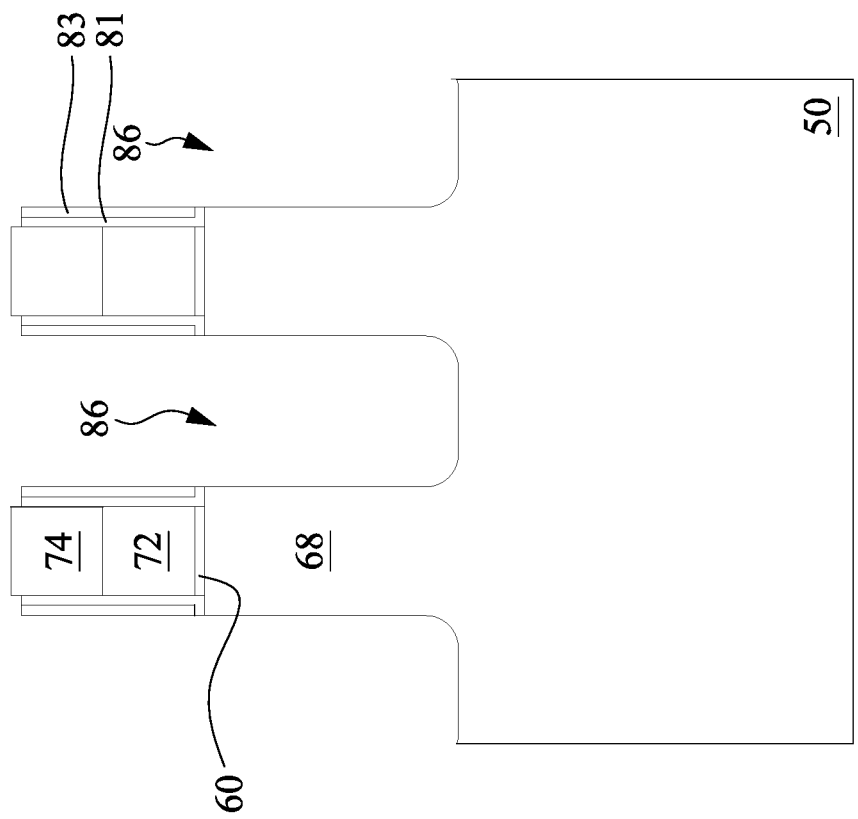
Figure 9A:
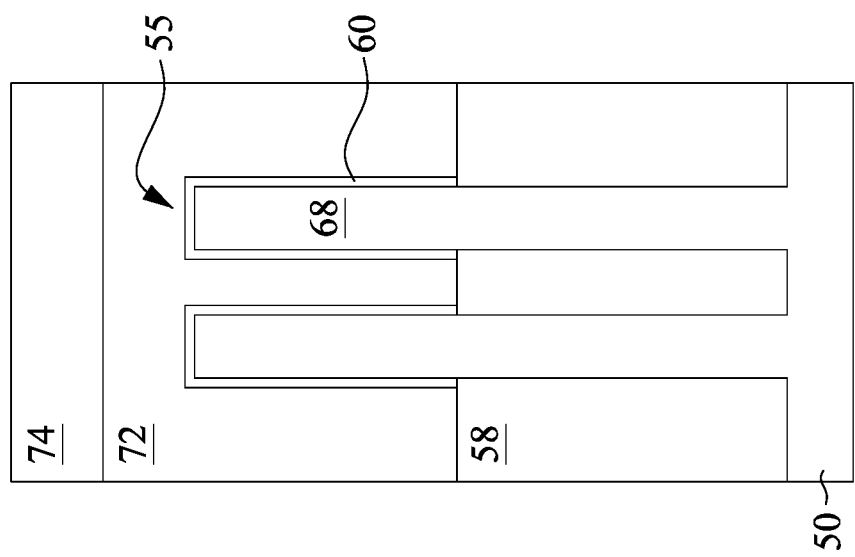
Figure 9C:
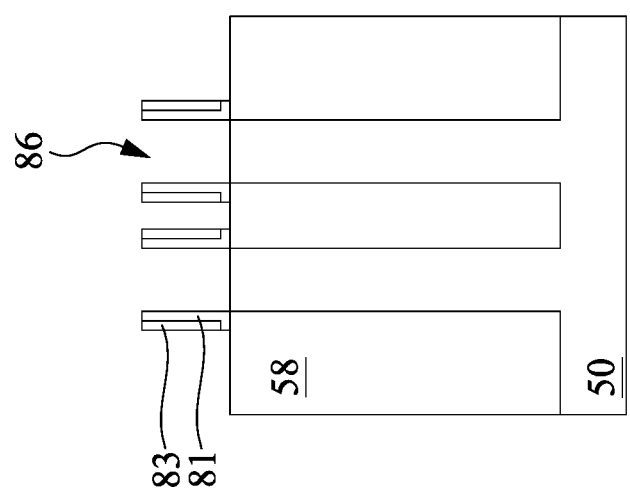

In FIGS. 9A through 9C, the substrate 50 and the fins 55 are etched to form first recesses 86. As illustrated in FIG. 9C, top surfaces of the STI regions 58 may be level with top surfaces of the fins 55. In some embodiments, bottom surfaces of the first recesses 86 are disposed above or below the top surfaces of the STI regions 58. The substrate 50/fins 55 are etched using anisotropic etching processes, such as RIE, NBE, or the like. The first spacers 81, the second spacers 83, and the masks 74 mask portions of the substrate 50/fins 55 during the etching processes used to form the first recesses 86. A single etch process or multiple etch processes may be used to form the first recesses 86. Timed etch processes may be used to stop the etching of the first recesses 86 after the first recesses 86 reach a desired depth.

Figure 10B:
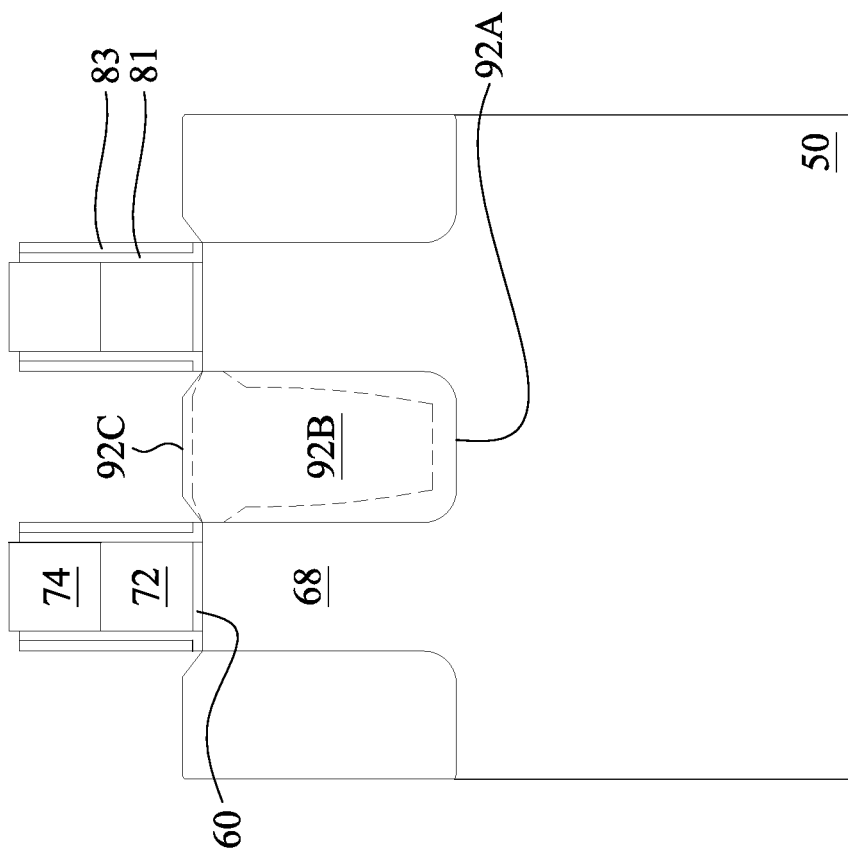

In FIGS. 10A through 10D, epitaxial source/drain regions 92 are formed in the first recesses 86 to exert stress on the channel regions 68 of the fins 55, thereby improving performance. As illustrated in FIG. 10B, the epitaxial source/drain regions 92 are formed in the first recesses 86 such that each dummy gate 72 is disposed between respective neighboring pairs of the epitaxial source/drain regions 92. In some embodiments, the first spacers 81 and second spacers 83 are used to separate the epitaxial source/drain regions 92 from the dummy gates 72 by an appropriate lateral distance so that the epitaxial source/drain regions 92 do not short out subsequently formed gates of the resulting FinFETs.

The epitaxial source/drain regions 92 in the region 50N, e.g., the NMOS region, may be formed by masking the region 50P, e.g., the PMOS region. Then, the epitaxial source/drain regions 92 are epitaxially grown in the first recesses 86. The epitaxial source/drain regions 92 may include any acceptable material, such as appropriate for n-type FinFETs. For example, if the fins 55 are silicon, the epitaxial source/drain regions 92 may include materials exerting a tensile strain on the fins 55, such as silicon, silicon carbide, phosphorous doped silicon carbide, silicon phosphide, or the like. The epitaxial source/drain regions 92 may have surfaces raised from respective surfaces of the fins 55 and may have facets.

The epitaxial source/drain regions 92 in the region 50P, e.g., the PMOS region, may be formed by masking the region 50N, e.g., the NMOS region. Then, the epitaxial source/drain regions 92 are epitaxially grown in the first recesses 86. The epitaxial source/drain regions 92 may include any acceptable material, such as appropriate for p-type NSFETs. For example, if the fins 55 are silicon, the epitaxial source/drain regions 92 may comprise materials exerting a compressive strain on the fins 55, such as silicon-germanium, boron doped silicon-germanium, germanium, germanium tin, or the like. The epitaxial source/drain regions 92 may also have surfaces raised from respective surfaces of the fins 55 and may have facets.

The epitaxial source/drain regions 92, the fins 55, and/or the substrate 50 may be implanted with dopants to form source/drain regions, similar to the process previously discussed for forming lightly-doped source/drain regions, followed by an anneal. The source/drain regions may have an impurity concentration of between about $1 \times 10^{19}$ atoms/cm$^3$ and about $1 \times 10^{21}$ atoms/cm$^3$. The n-type and/or p-type impurities for source/drain regions may be any of the impurities previously discussed. In some embodiments, the epitaxial source/drain regions 92 may be in situ doped during growth.

As a result of the epitaxy processes used to form the epitaxial source/drain regions 92 in the region 50N and the region 50P, upper surfaces of the epitaxial source/drain regions 92 have facets which expand laterally outward beyond sidewalls of the fins 55. In some embodiments, these facets cause adjacent epitaxial source/drain regions 92 of a same FinFET to merge as illustrated by FIG. 1C. In some embodiments, adjacent epitaxial source/drain regions 92 remain separated after the epitaxy process is completed as illustrated by FIG. 10D. In the embodiments illustrated in FIGS. 10C and 10D, the first spacers 81 may be formed covering portions of the sidewalls of the fins 55 that extend above the STI regions 58 thereby blocking the epitaxial growth. In some embodiments, the spacer etch used to form the first spacers 81 may be adjusted to remove the spacer material to allow the epitaxially grown region to extend to the surface of the STI region 58.

The epitaxial source/drain regions 92 may comprise one or more semiconductor material layers. For example, the epitaxial source/drain regions 92 may comprise a first semiconductor material layer 92A, a second semiconductor material layer 92B, and a third semiconductor material layer 92C. Any number of semiconductor material layers may be used for the epitaxial source/drain regions 92. Each of the first semiconductor material layer 92A, the second semiconductor material layer 92B, and the third semiconductor material layer 92C may be formed of different semiconductor materials and/or may be doped to different dopant concentrations. In some embodiments, the first semiconductor material layer 92A may have a dopant concentration less than the second semiconductor material layer 92B and greater than the third semiconductor material layer 92C. In embodiments in which the epitaxial source/drain regions 92 comprise three semiconductor material layers, the first semiconductor material layer 92A may be deposited, the second semiconductor material layer 92B may be deposited over the first semiconductor material layer 92A, and the third semiconductor material layer 92C may be deposited over the second semiconductor material layer 92B.

Figure 10A:
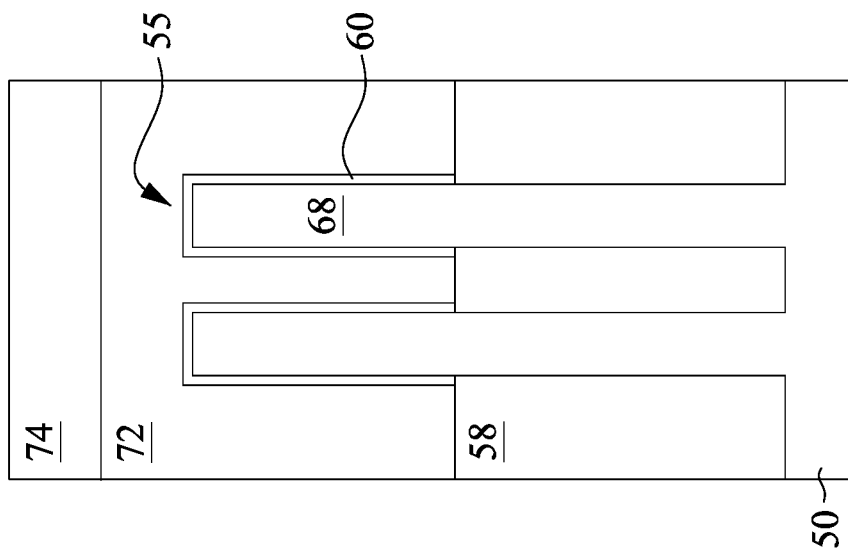
Figure 10C:
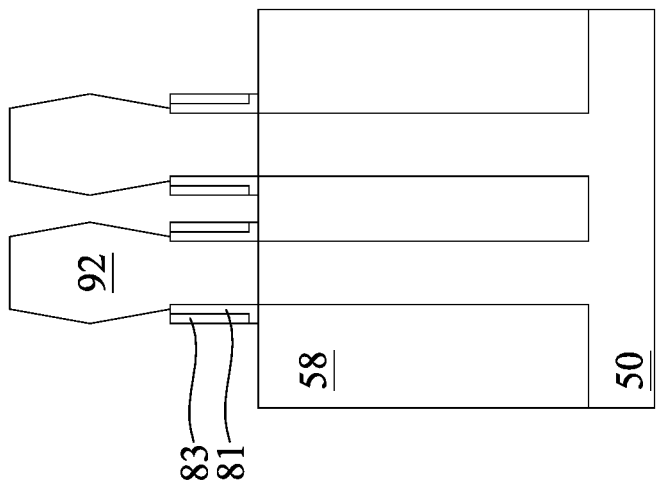
Figure 10D:
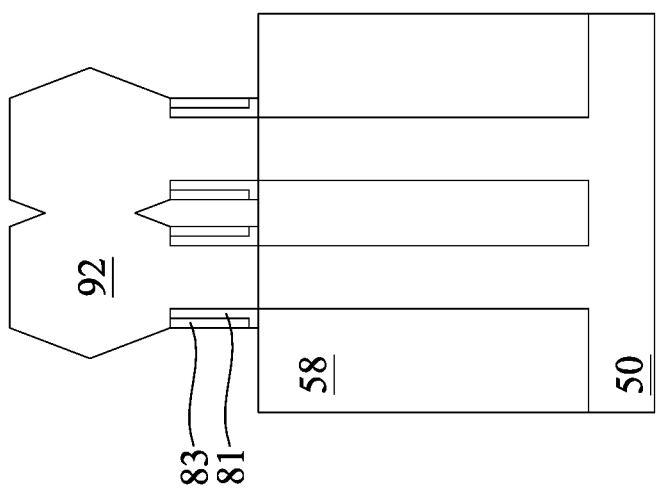
Figure 11B:
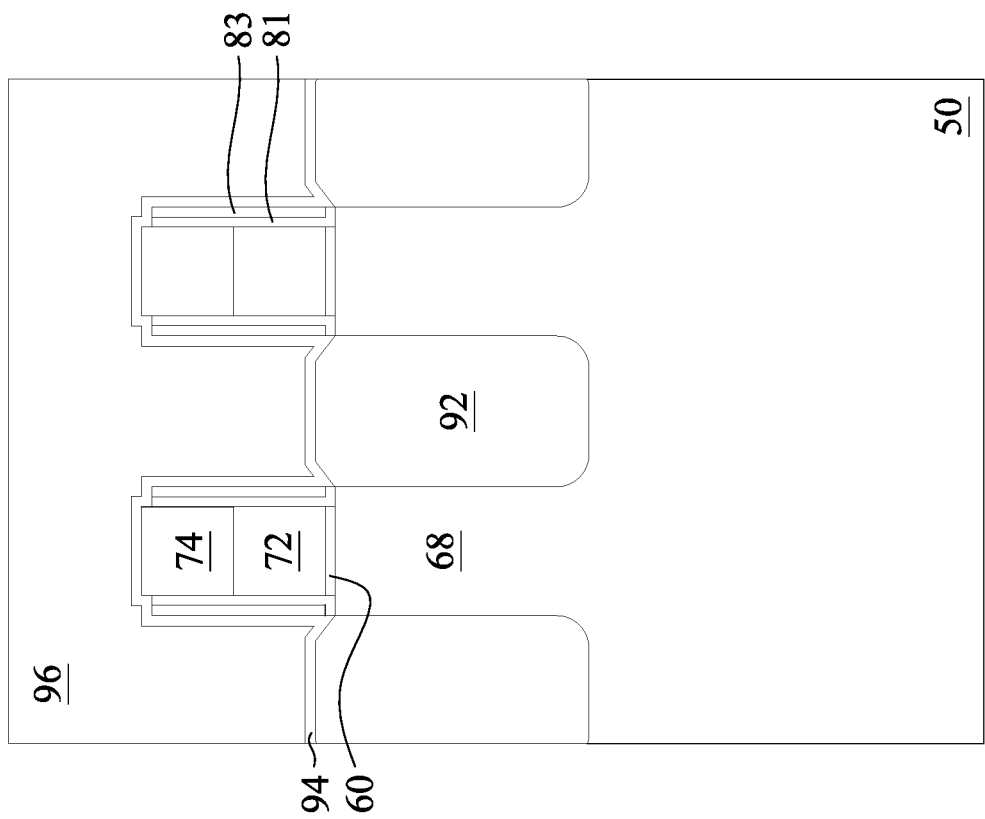
Figure 11A:
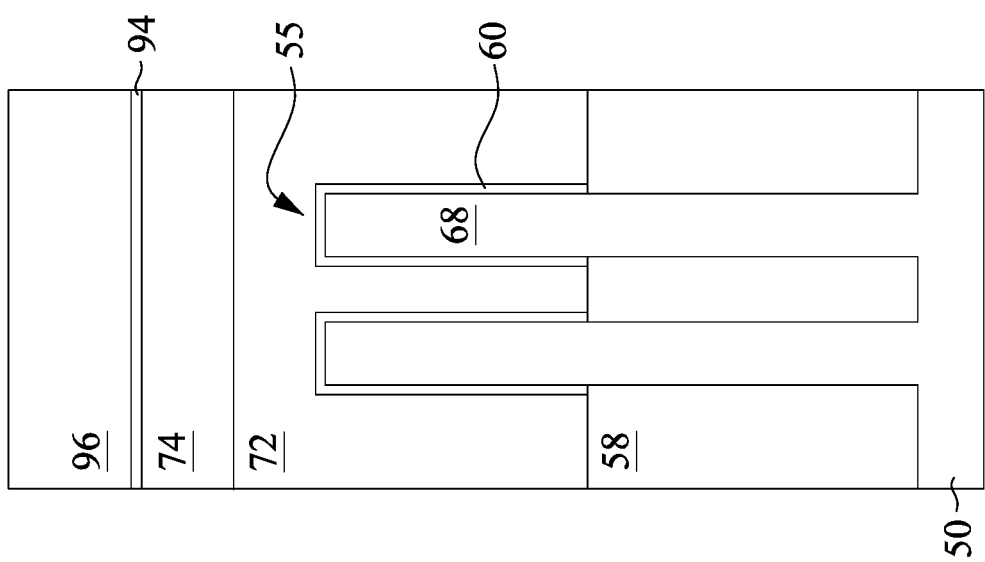

In FIGS. 11A and 11B, a first interlayer dielectric (ILD) 96 is deposited over the structure illustrated in FIGS. 10A and 10B, respectively. The first ILD 96 may be formed of a dielectric material, and may be deposited by any suitable method, such as CVD, plasma-enhanced CVD (PECVD), or FCVD. Dielectric materials may include phospho-silicate glass (PSG), boro-silicate glass (BSG), boron-doped phospho-silicate glass (BPSG), undoped silicate glass (USG), or the like. In some embodiments, the dielectric materials for the first ILD 96 may include silicon oxide, silicon nitride, silicon oxynitride, or the like. Other insulation materials formed by any acceptable process may be used. In some embodiments, a contact etch stop layer (CESL) 94 is disposed between the first ILD 96 and the epitaxial source/drain regions 92, the masks 74, the first spacers 81, and the second spacers 83. The CESL 94 may comprise a dielectric material, such as, silicon nitride, silicon oxide, silicon oxynitride, or the like, having a different etch rate than the material of the overlying first ILD 96. In some embodiments, the first ILD 96 may be formed of silicon oxide or silicon nitride and the CESL 94 may be formed of silicon oxide or silicon nitride.

Figure 12B:
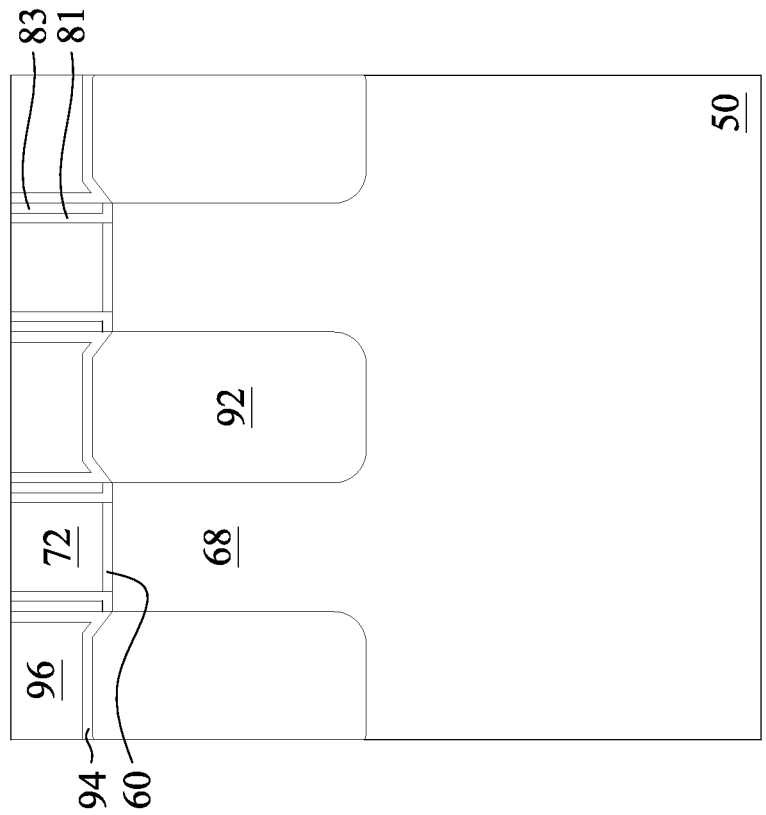
Figure 12A:
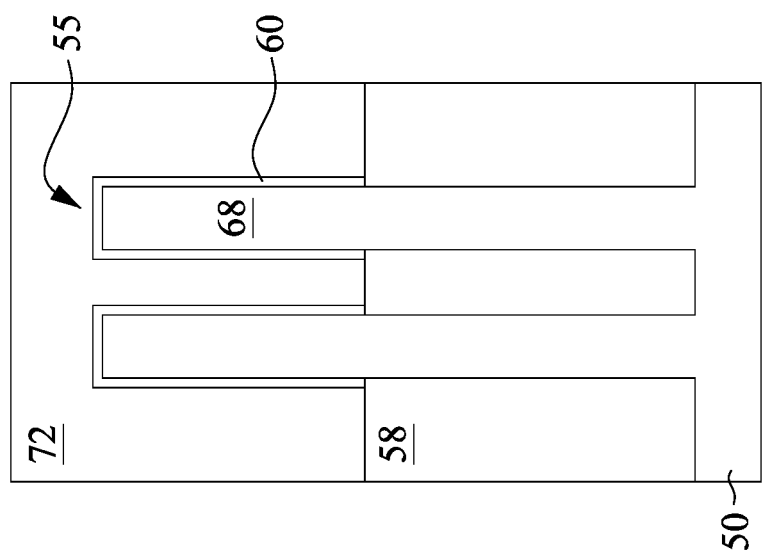

In FIGS. 12A and 12B, a planarization process, such as a CMP, may be performed to level the top surface of the first ILD 96 with the top surfaces of the dummy gates 72 or the masks 74. The planarization process may also remove the masks 74 on the dummy gates 72, and portions of the first spacers 81 and the second spacers 83 along sidewalls of the masks 74. After the planarization process, top surfaces of the dummy gates 72, the first spacers 81, and the first ILD 96 are level. Accordingly, the top surfaces of the dummy gates 72 are exposed through the first ILD 96. In some embodiments, the masks 74 may remain, in which case the planarization process levels the top surface of the first ILD 96 with top surface of the masks 74 and the first spacers 81.

Figure 13B:
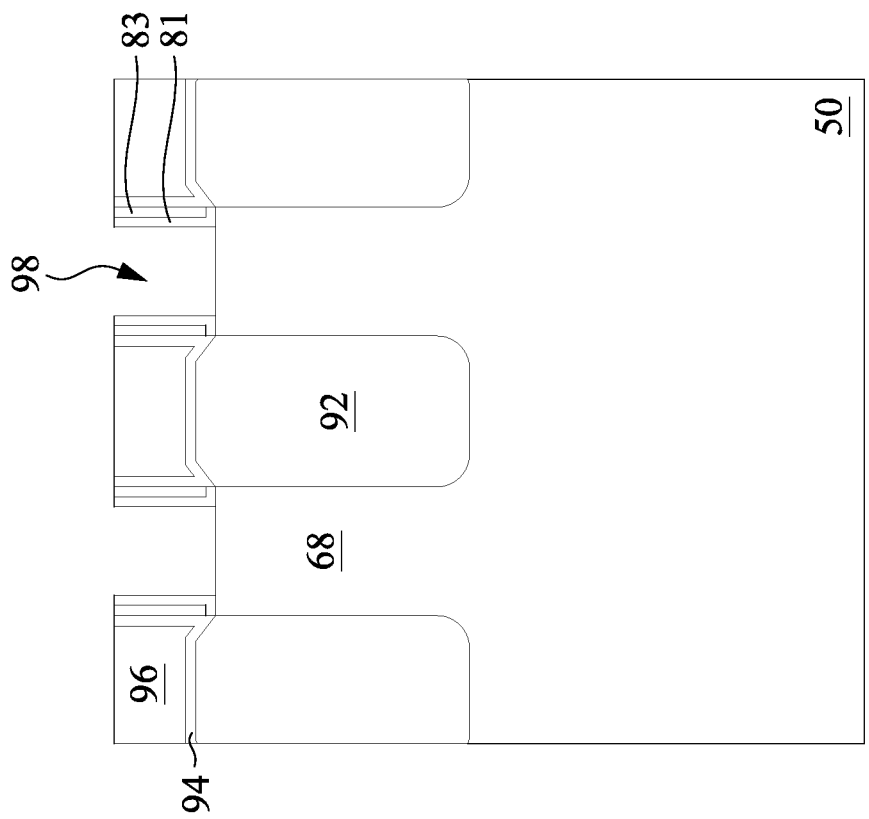
Figure 13A:
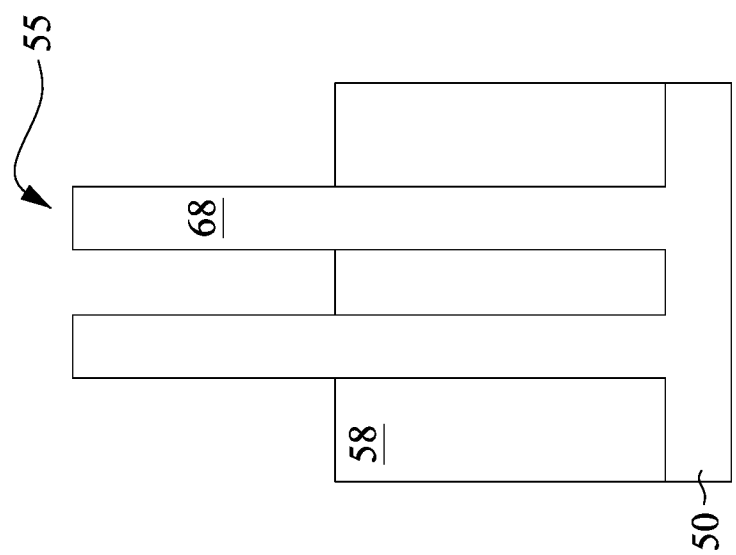

In FIGS. 13A and 13B, the dummy gates 72, and the masks 74 if present, are removed in an etching step(s), so that second recesses 98 are formed. Portions of the dummy dielectric layers 60 in the second recesses 98 may also be removed. In some embodiments, only the dummy gates 72 are removed and the dummy dielectric layers 60 remain and are exposed by the second recesses 98. In some embodiments, the dummy dielectric layers 60 are removed from second recesses 98 in a first region of a die (e.g., a core logic region) and remain in second recesses 98 in a second region of the die (e.g., an input/output region). In some embodiments, the dummy gates 72 are removed by an anisotropic dry etch process. For example, the etching process may include a dry etch process using reaction gas(es) that selectively etch the dummy gates 72 at a faster rate than the first ILD 96 or the first spacers 81. Each second recess 98 exposes and/or overlies a channel region 68 of a respective fin 55. Each channel region 68 is disposed between neighboring pairs of the epitaxial source/drain regions 92. During the removal, the dummy dielectric layer 60 may be used as an etch stop layer when the dummy gates 72 are etched. The dummy dielectric layer 60 may be optionally removed after removing the dummy gates 72.

Figure 14B:
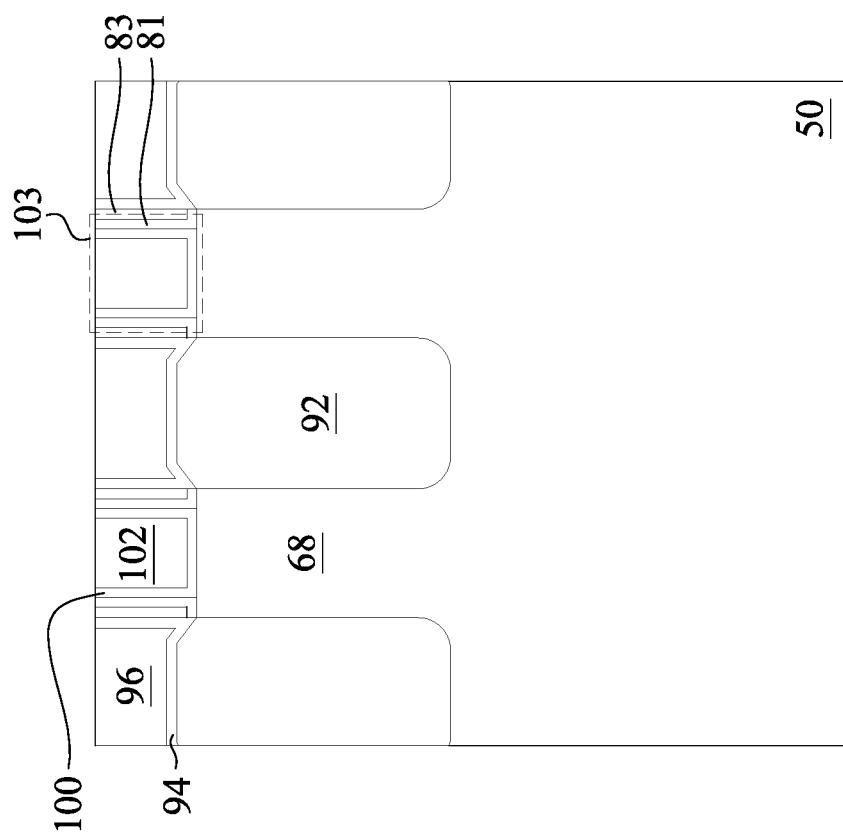
Figure 14A:
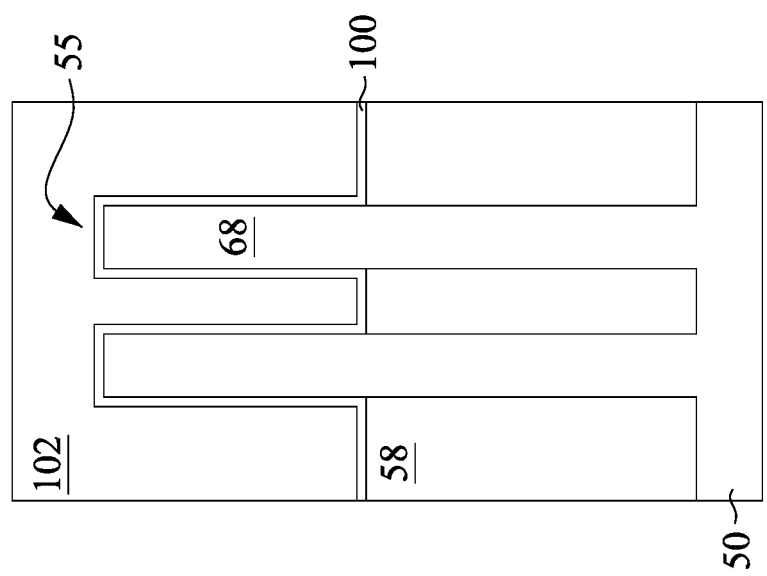
Figure 14C:
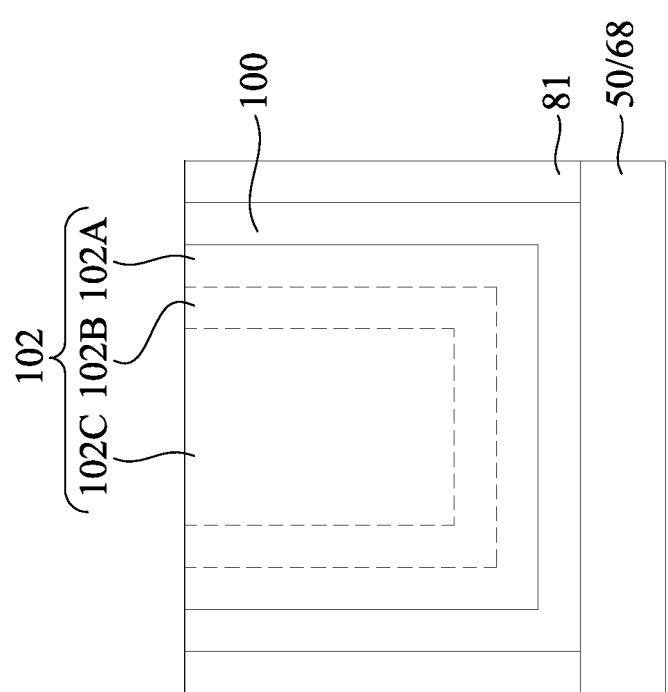

In FIGS. 14A and 14B, gate dielectric layers 100 and gate electrodes 102 are formed for replacement gates. FIG. 14C illustrates a detailed view of region 103 of FIG. 14B. The gate dielectric layers 100 may be formed by depositing one or more layers in the second recesses 98, such as on top surfaces and sidewalls of the fins 55 and the first spacers 81 and on top surfaces of the STI regions 58, the first ILD 96, the CESL 94, and the second spacers 83. The gate dielectric layers 100 may comprise one or more layers of silicon oxide, silicon nitride, metal oxides, metal silicates, or the like. For example, in some embodiments, the gate dielectric layers 100 include an interfacial layer of silicon oxide formed by thermal or chemical oxidation and an overlying high-k dielectric material, such as a metal oxide or a silicate of hafnium, aluminum, zirconium, lanthanum, manganese, barium, titanium, lead, a combination thereof, or the like. The gate dielectric layers 100 may include a dielectric layer having a k-value greater than about 7.0. The gate dielectric layers 100 may be deposited by molecular-beam deposition (MBD), ALD, PECVD, or the like. In embodiments where portions of the dummy dielectric layer 60 remain in the second recesses 98, the gate dielectric layers 100 may include a material of the dummy dielectric layer 60 (e.g., $SiO_2$).

The gate electrodes 102 are deposited over the gate dielectric layers 100 and fill remaining portions of the second recesses 98. The gate electrodes 102 may include a metal-containing material such as titanium nitride, titanium oxide, tantalum nitride, tantalum carbide, cobalt, ruthenium, aluminum, tungsten, combinations thereof, or multi-layers thereof. For example, although a single layer gate electrode 102 is illustrated in FIG. 14B, the gate electrodes 102 may comprise any number of liner layers 102A, any number of work function tuning layers 102B, and a fill material 102C as illustrated by FIG. 14C. After the filling of the second recesses 98, a planarization process, such as a CMP, is performed to remove excess portions of the gate dielectric layers 100 and the gate electrodes 102, which excess portions are over top surfaces of the first ILD 96. The remaining portions of the gate electrodes 102 and the gate dielectric layers 100 form replacement gates of the resulting FinFETs. The gate electrodes 102 and the gate dielectric layers 100 may be collectively referred to as "gate stacks." The gate stacks may extend along sidewalls of the channel regions 68 of the fins 55.

The formation of the gate dielectric layers 100 in the region 50N and the region 50P may occur simultaneously such that the gate dielectric layers 100 in each region are formed from the same materials. The formation of the gate electrodes 102 may occur simultaneously such that the gate electrodes 102 in each region are formed from the same materials. In some embodiments, the gate dielectric layers 100 in each region may be formed by distinct processes, such that the gate dielectric layers 100 may be different materials. The gate electrodes 102 in each region may be formed by distinct processes, such that the gate electrodes 102 may be different materials. Various masking steps may be used to mask and expose appropriate regions when using distinct processes.

Figure 15B:
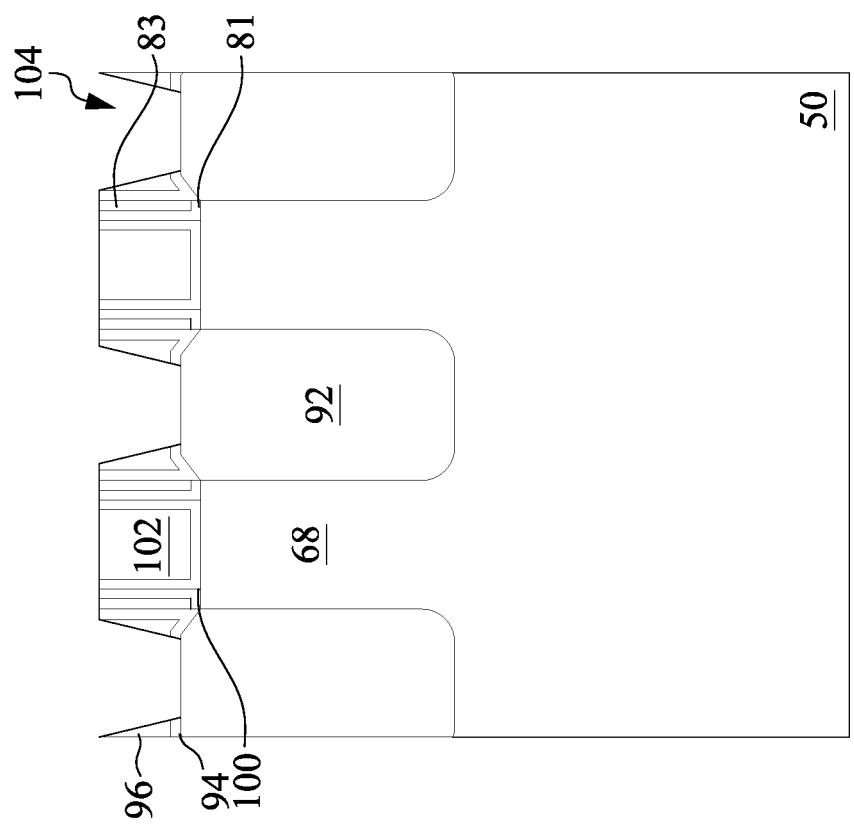
Figure 15A:
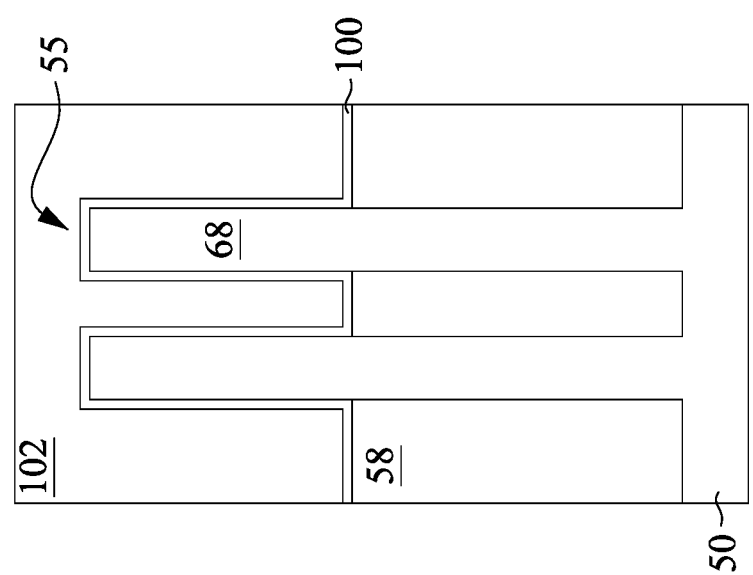
Figure 15C:
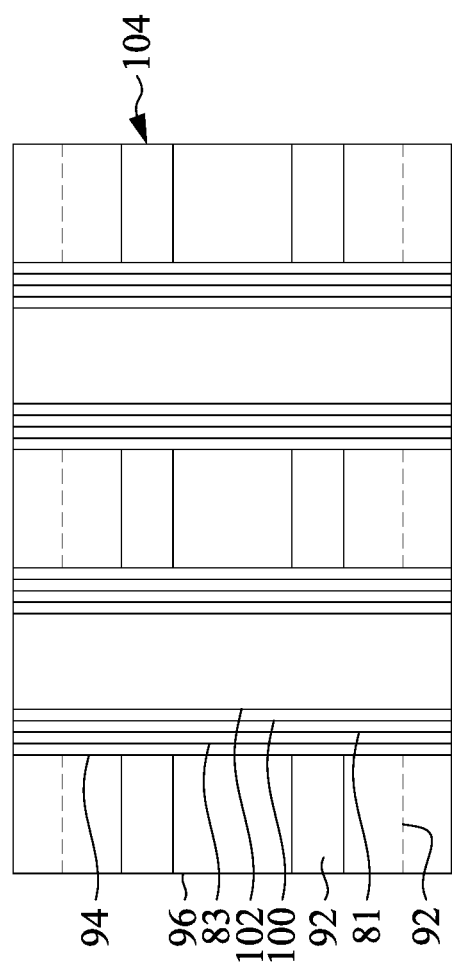

In FIGS. 15A through 15C, the first ILD 96 and the CESL 94 are etched to form third recesses 104 exposing surfaces of the epitaxial source/drain regions 92. The third recesses 104 may be formed using acceptable photolithography and etching techniques. The etching may be any acceptable etching process, such as reactive ion etching (RIE), neutral beam etching (NBE), the like, or a combination thereof. The etching may be anisotropic.

Figure 16C:
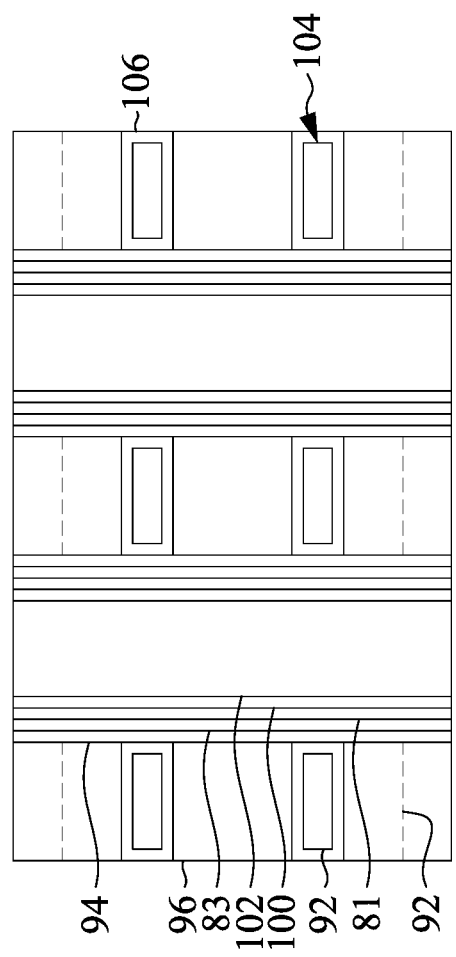

In FIGS. 16A through 16C, a liner 106, such as a diffusion barrier layer, an adhesion layer, or the like, is formed in the third recesses 104. The liner 106 may include titanium, titanium nitride, tantalum, tantalum nitride, silicon nitride, or the like. The liner 106 may be deposited by a conformal process, such as CVD, ALD, or the like. The liner 106 may be deposited along top surfaces of the gate electrodes 102, the gate dielectric layers 100, the first spacers 81, the second spacers 83, and the epitaxial source/drain regions 92; and along top surfaces and sidewalls of the first ILD 96 and the CESL 94. The liner 106 may then be etched using a suitable etching process, such as an anisotropic etching process (e.g., a dry etching process) or the like to remove lateral portions of the liner 106 and expose surfaces of the epitaxial source/drain regions 92. Etching the liner 106 may further remove portions of the liner 106 from above the top surfaces of the gate electrodes 102, the gate dielectric layers 100, the first spacers 81, the second spacers 83, the first ILD 96, and the CESL 94. The liner 106 may have a thickness ranging from about 1 nm to about 2 nm.

Figure 17B:
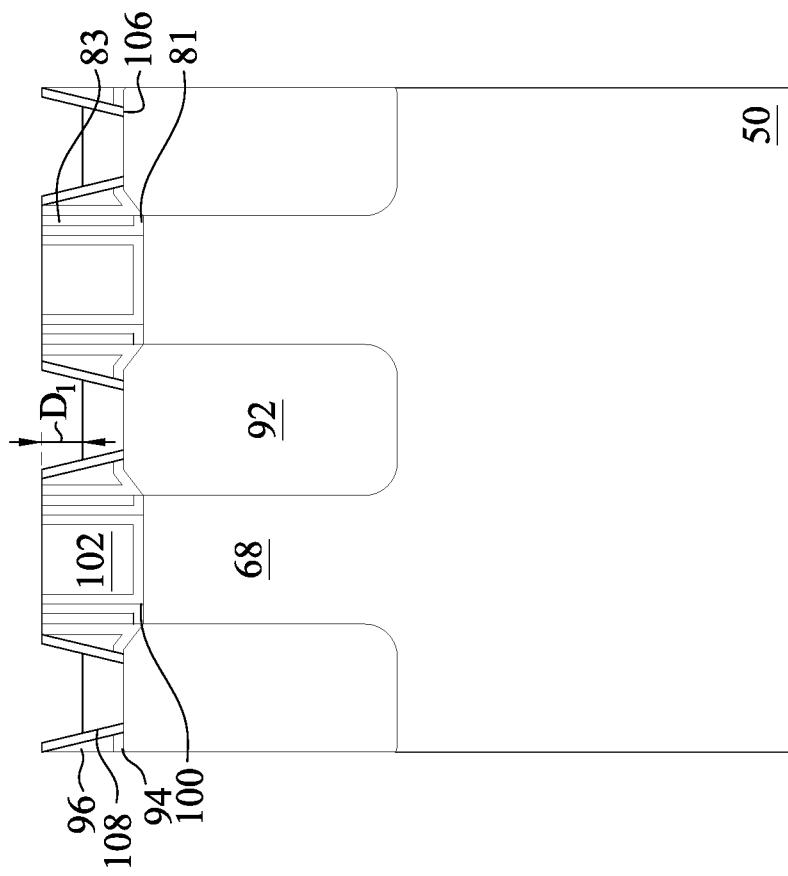
Figure 17A:
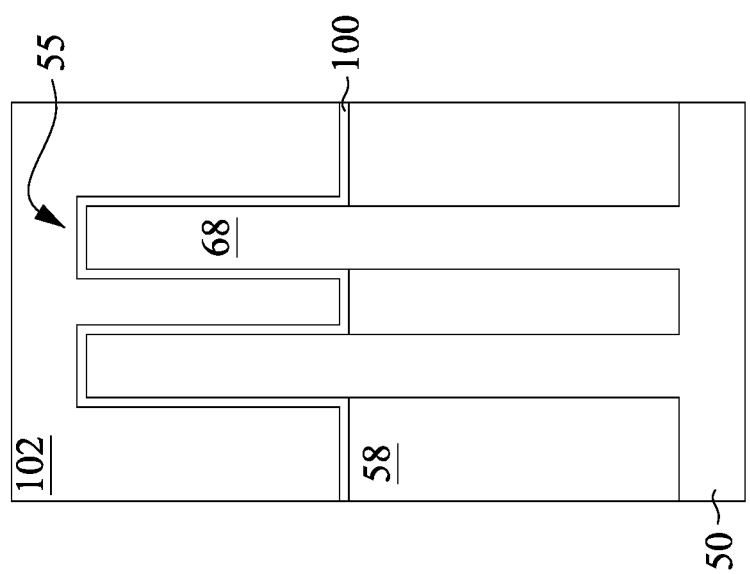
Figure 17C:
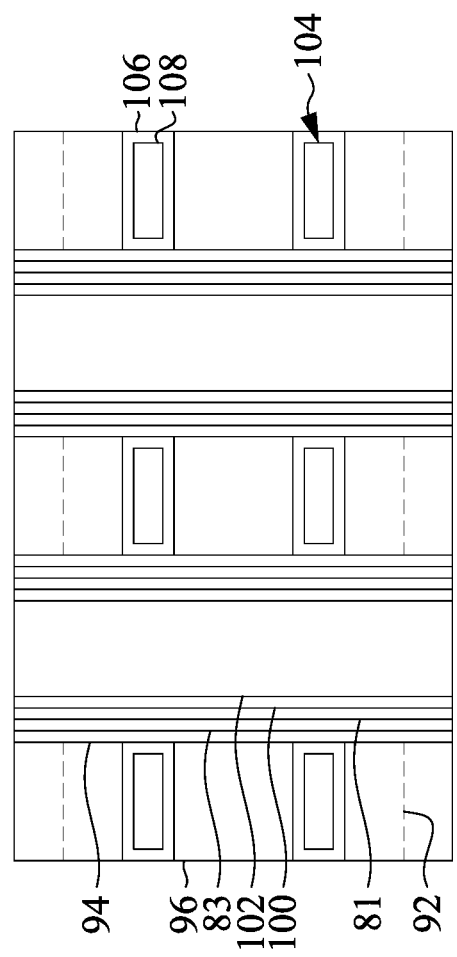
Figure 18B:
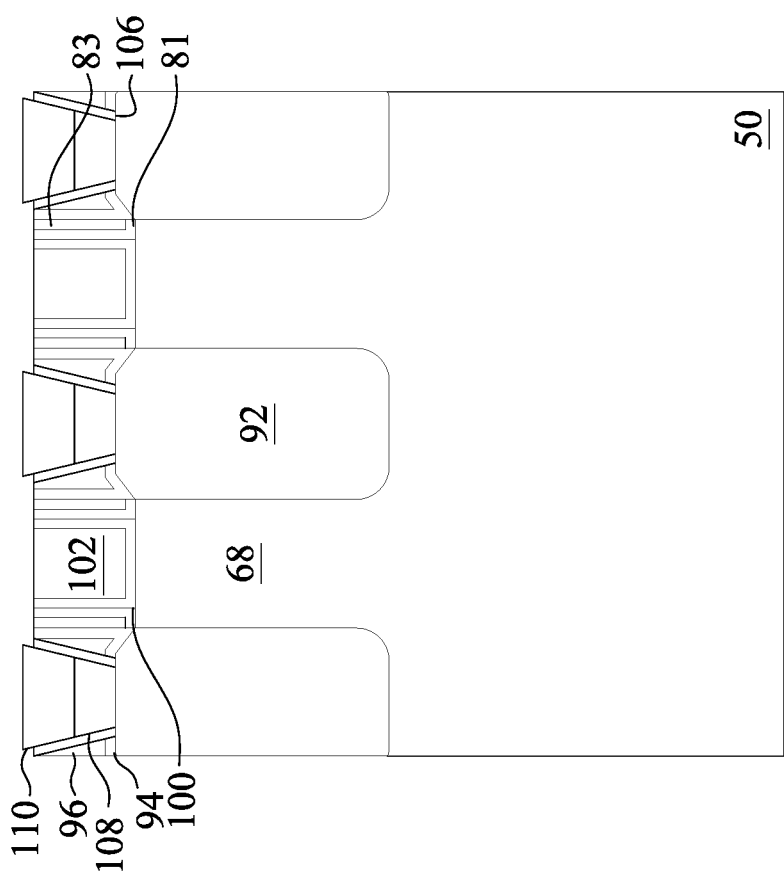
Figure 18A:
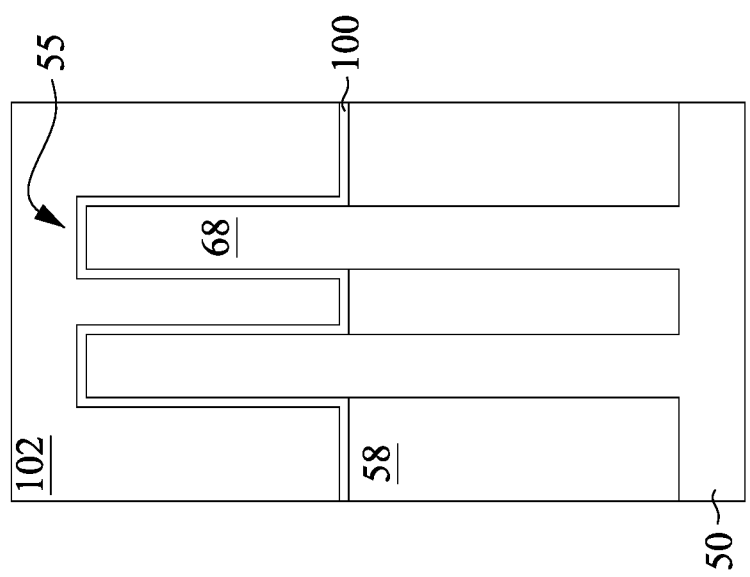

In FIGS. 17A through 17C, a first contact material 108 is formed in the third recesses 104 over the epitaxial source/drain regions 92 and the liner 106. The first contact material 108 may be a conductive material, such as cobalt (Co), tungsten (W), ruthenium (Ru), copper (Cu), molybdenum (Mo), combinations thereof, or the like. The first contact material 108 may be deposited using a deposition process such as sputtering, chemical vapor deposition, atomic layer deposition, electroplating, electroless plating, or the like. In some embodiments, the first contact material 108 may be deposited to fill or overfill the third recesses 104. The first contact material 108 may be planarized with top surfaces of the first ILD 96, the CESL 94, the liner 106, the gate electrodes 102, the gate dielectric layers 100, the first spacers 81, and the second spacers 83. The first contact material 108 may then be recessed to a level below the top surfaces of the first ILD 96, the CESL 94, the liner 106, the gate electrodes 102, the gate dielectric layers 100, the first spacers 81, and the second spacers 83. In an embodiment the first contact material 108 is recessed using a wet or dry etching process that uses one or more etchants that are selective to the material of the first contact material 108 (e.g., cobalt or the like) without significantly removing the material of the first ILD 96, the CESL 94, the liner 106, the gate electrodes 102, the gate dielectric layers 100, the first spacers 81, and the second spacers 83. The first contact material 108 may be recessed a first distance $D_1$ of between about 18 nm and about 25 nm. However, any suitable distance may be utilized. An anneal process may be performed to form a silicide at the interface between the epitaxial source/drain regions 92 and the first contact material 108. The first contact material 108 is physically and electrically coupled to the epitaxial source/drain regions 92.

In FIGS. 18A through 18D, a second contact material 110 is formed in the third recesses 104 over the first contact material 108. The second contact material 110 may be a conductive material, such as tungsten (W), ruthenium (Ru), cobalt (Co), copper (Cu), molybdenum (Mo), combinations thereof, or the like. The second contact material 110 may be deposited using a deposition process such as sputtering, chemical vapor deposition, atomic layer deposition, electroplating, electroless plating, or the like. In some embodiments, the second contact material 110 may be deposited to fill or overfill the third recesses 104. In the embodiment illustrated in FIG. 18B, the second contact material 110 may be deposited by a plating process or the like and, following the deposition, top surfaces of the second contact material 110 may be disposed above top surfaces of the first ILD 96, the CESL 94, the liner 106, the gate electrodes 102, the gate dielectric layers 100, the first spacers 81, and the second spacers 83. In some embodiments, the second contact material 110 may be formed of a material different from a material of the first contact material 108. Using different materials for the second contact material 110 and the first contact material 108 lowers contact resistance, which improves device performance.

FIG. 18D illustrates an embodiment in which top surfaces of the first contact material 108 and the second contact material 110 are non-planar. As illustrated in FIG. 18D, top surfaces of the first contact material 108 and the second contact material 110 may be W-shaped or M-shaped in a cross-sectional view. The top surfaces of the first contact material 108 and the second contact material 110 may have one or more dimples. However, any suitable shapes are possible for the first contact material 108 and the second contact material 110, depending on the deposition and etch processes used to form the first contact material 108 and the second contact material 110. In some embodiments, the first contact material 108 and the second contact material 110 may be deposited by CVD at a temperature ranging from about 300° C. to about 500° C., by PVD at room temperature, or the like. The deposition process may be followed by an anneal process at a temperature ranging from about 300° C. to about 600° C. Dry etching processes, such as halogen-based processes, may be used to define the first contact material 108 and the second contact material 110. In some embodiments, the second contact material 110 may be deposited by a plating process or the like. Following the deposition, top surfaces of the second contact material 110 may be disposed above top surfaces of the first ILD 96, the CESL 94, the liner 106, the gate electrodes 102, the gate dielectric layers 100, the first spacers 81, and the second spacers 83.

Materials of the second contact material 110 and the liner 106 may not have good adhesion with one another, such that cracks or other defects may be formed between the second contact material 110 and the liner 106 during subsequent processes. For example, cracks may be formed between the second contact material 110 and the liner 106 during a subsequent process used to planarize the second contact material 110 (discussed below with respect to FIGS. 20A through 20D). The cracks may allow process fluids, such as a CMP slurry, to penetrate between the second contact material 110 and the liner 106 and the process fluids may remove material of the second contact material 110 and the first contact material 108, creating further device defects and reducing device performance.

Figure 19B:
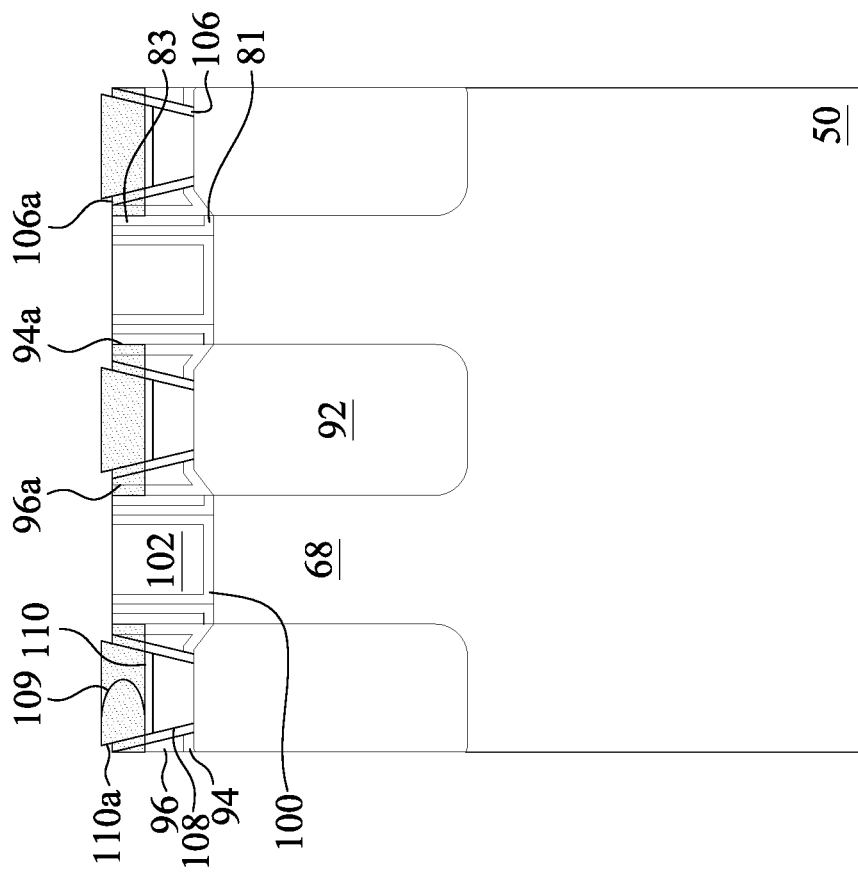
Figure 19A:
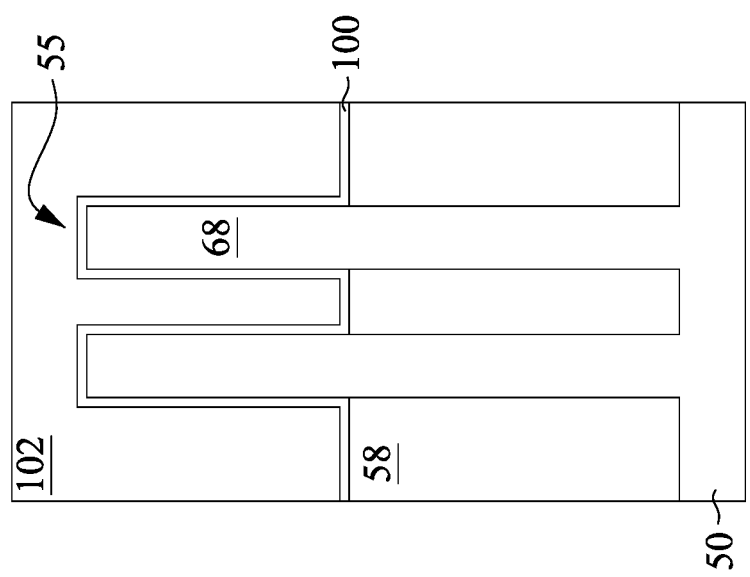
Figure 19F:
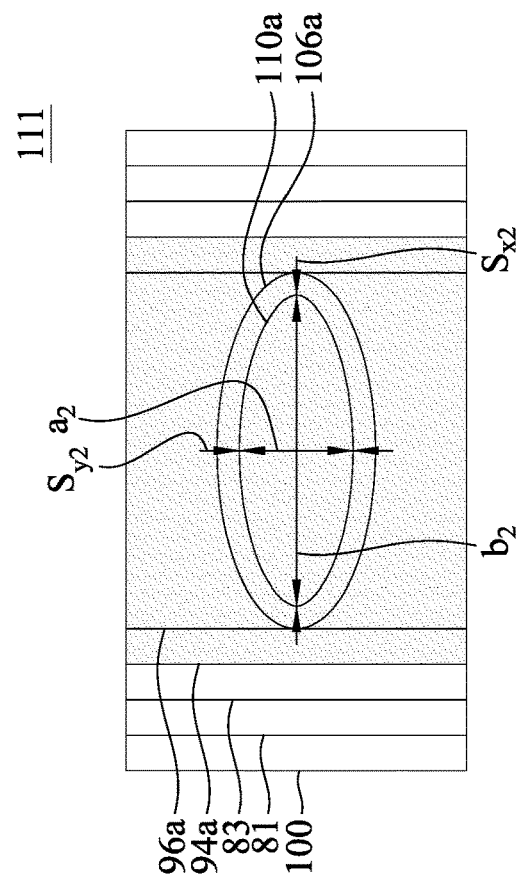
Figure 19E:
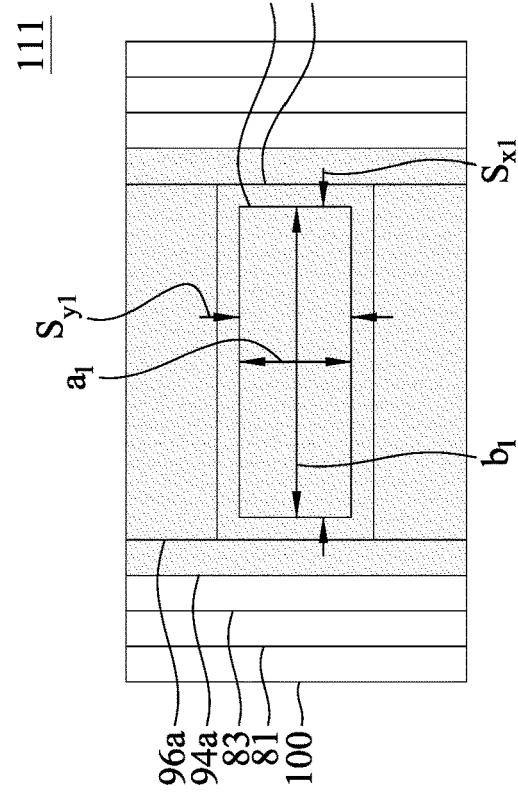
Figure 20B:
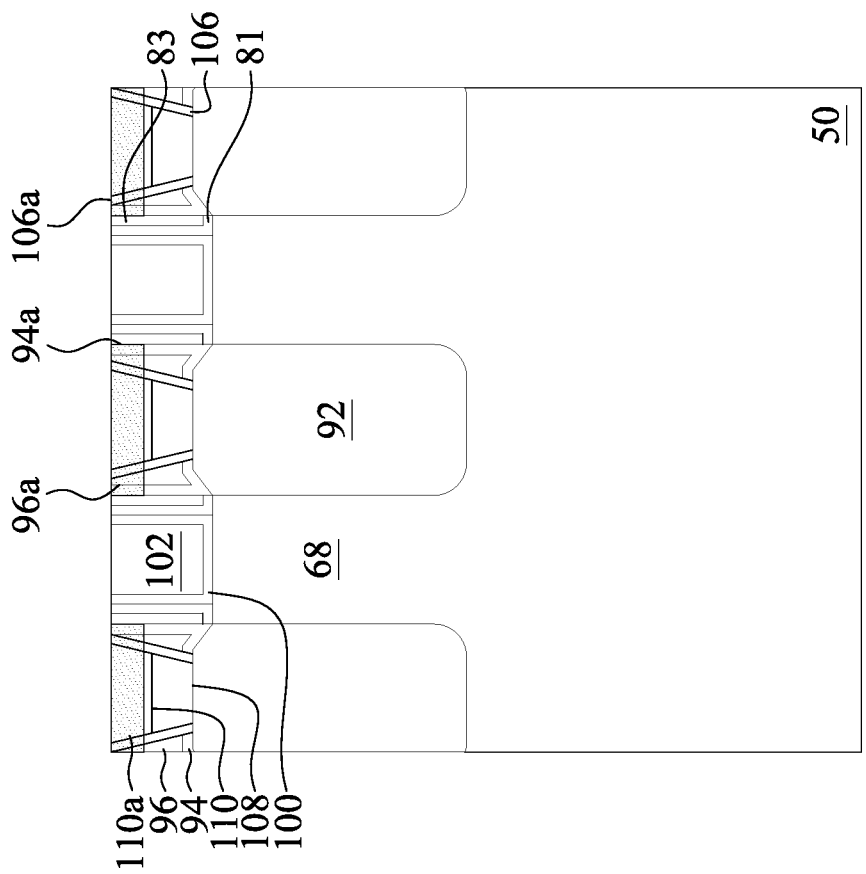
Figure 20A:
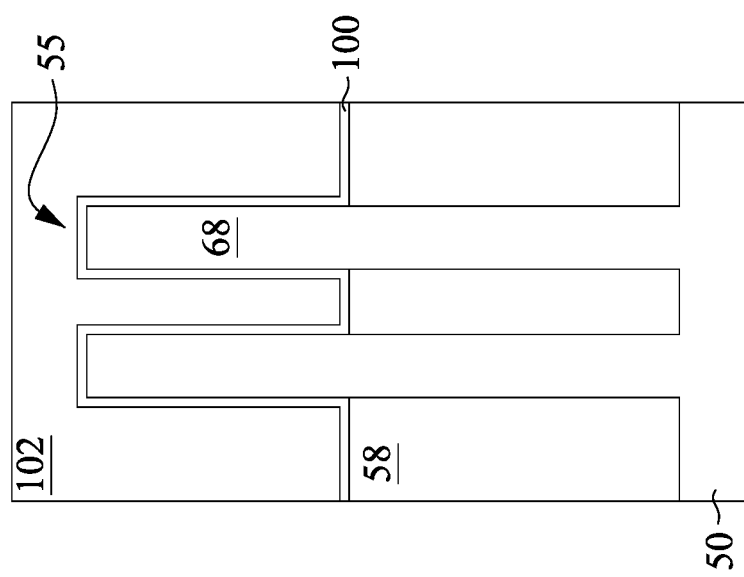
Figures 20C, 20D:
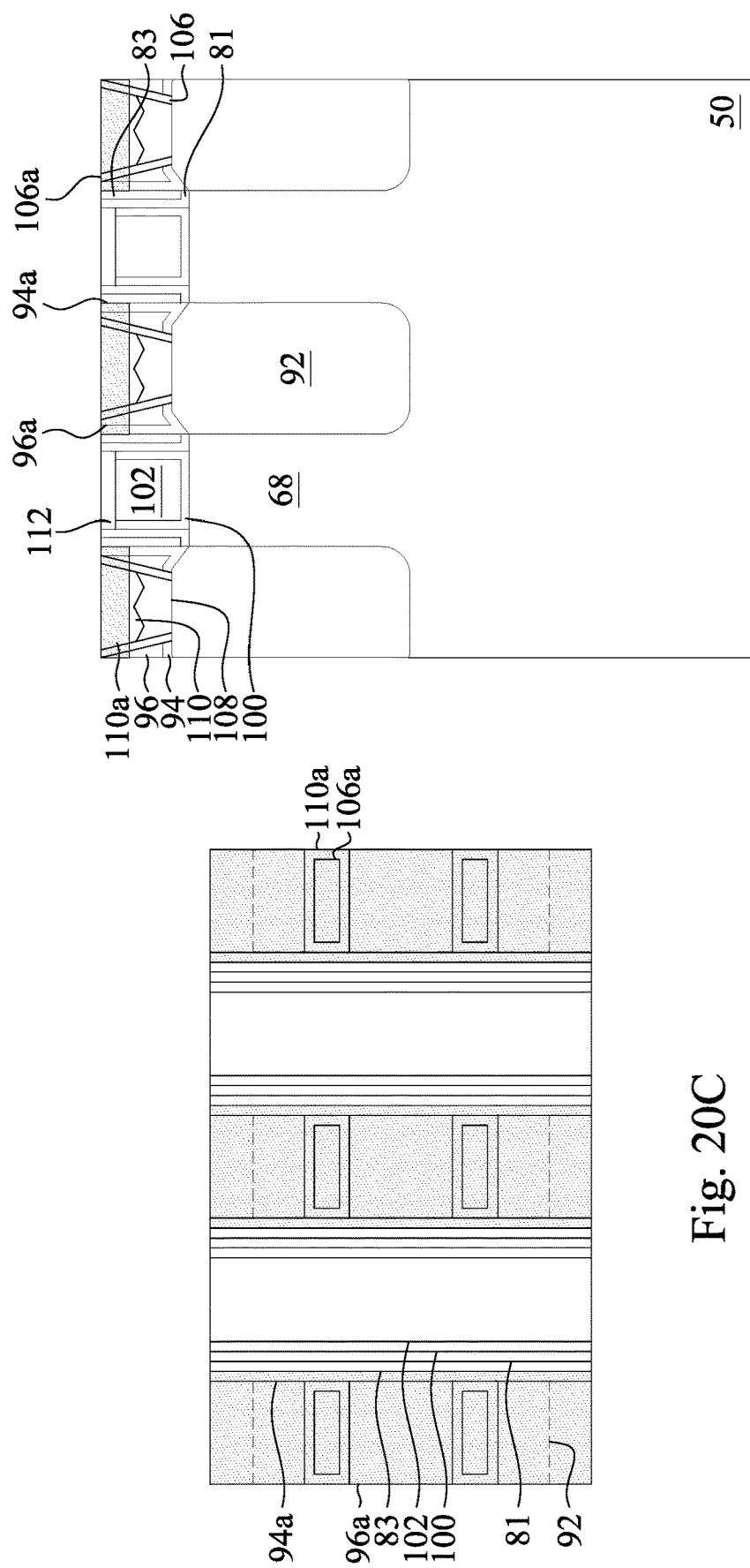

In FIGS. 19A through 19E, doped contact portions 110a are formed in the second contact material 110, doped liner portions 106a are formed in the liner 106, doped ILD portions 96a are formed in the first ILD 96, and doped CESL portions 94a are formed in the CESL 94. FIGS. 19E and 19F illustrate detailed views of a region 11 of FIG. 19C. Doping the liner 106, the first ILD 96, and the CESL 94 to form the doped liner portions 106a, the doped ILD portions 96a, and the doped CESL portions 94a, respectively, may cause materials of the liner 106, the first ILD 96, and the CESL 94 to expand, improving sealing between the doped contact portions 110a the doped liner portions 106a. The improved sealing between doped liner portions 106a and the doped contact portions 110a prevents process fluids, such as a CMP slurry, from penetrating between the doped liner portions 106a and the doped contact portions 110a. This prevents materials of the doped contact portions 110a, the second contact material 110, and the first contact material 108 from being undesirably removed by the process fluids or the like, which reduces device defects and improves device performance.

Outer surfaces of each of the doped liner portions 106a, the doped ILD portions 96a, and the doped CESL portions 94a may expand outwards a distance ranging from about 1 nm to about 10 nm or from about 1 nm to about 5 nm. Expansion of the doped liner portions 106a, the doped ILD portions 96a, and the doped CESL portions 94a by at least this amount improves the sealing between the doped contact portions 110a and each of the doped liner portions 106a, the doped ILD portions 96a, and the doped CESL portions 94a, which prevents process fluids from penetrating between the doped contact portions 110a, the second contact materials 110, and the first contact materials 108 and each of the doped liner portions 106a, the doped ILD portions 96a, and the doped CESL portions 94a. This prevents undesired removal of material from each of the doped contact portions 110a, the second contact material 110, and the first contact material 108, reduces device defects, and improves device performance.

The dopants in each of the doped contact portions 110a, the doped liner portions 106a, the doped ILD portions 96a, and the doped CESL portions 94a, may extend to a depth ranging from about 1 nm to about 15 nm or from about 1 nm to about 10 nm. Although bottom extents of each of the doped contact portions 110a, the doped liner portions 106a, the doped ILD portions 96a, and the doped CESL portions 94a are illustrated as being aligned with one another at the same depth, any of the bottom surfaces of the doped contact portions 110a, the doped liner portions 106a, the doped ILD portions 96a, and the doped CESL portions 94a may be misaligned with one another and may extend to different depths. In the embodiment illustrated in FIGS. 19A through 19D, the first contact material 108 is free from the dopants. However, in some embodiments, the dopants may extend throughout a partial thickness or the entire thickness of the second contact material 110 and the dopants may extend into the first contact material 108.

In some embodiments, the doped contact portions 110a, the doped liner portions 106a, the doped ILD portions 96a, and the doped CESL portions 94a may include the same dopants, which may include germanium (Ge), silicon (Si), argon (Ar), xenon (Xe), arsenic (As), nitrogen (N), combinations thereof, or the like. In some embodiments, the doped contact portions 110a, the doped liner portions 106a, the doped ILD portions 96a, and the doped CESL portions 94a may further include hydrogen (H), which may be implanted from ambient air or the like along with the dopants. The doped contact portions 110a, the doped CESL portions 94a, the doped liner portions 106a, and the doped ILD portions 96a may be formed by an ion implantation. A dosage for the ion implantation may range from about $1\times10^{14}$ atoms/cm$^2$ to about $1\times10^{16}$ atoms/cm$^2$ and a tilt angle for the ion implantation may range from about 0 degrees to about 60 degrees. The ion implantation may be performed at a temperature ranging from about −100° C. to about 500° C. with an applied energy ranging from about 2 keV to about 50 keV. In some embodiments, performing the ion implantation at a temperature ranging from about −100° C. to about 25° C. may provide for greater expansion of the doped liner portions 106a, the doped ILD portions 96a, and/or the doped CESL portions 94a, which may further improve sealing between the doped contact portions 110a and the doped liner portions 106a. In some embodiments, concentrations of the dopants in each of the doped liner portions 106a, the doped ILD portions 96a, and the doped CESL portions 94a may range from about $1\times10^{20}$ atoms/cm$^3$ to about $2\times10^{22}$ atoms/cm$^3$. In some embodiments, concentrations of the dopants in the doped contact portions 110a may range from about $1\times10^{18}$ atoms/cm$^3$ to about $1\times10^{21}$ atoms/cm$^3$.

The distribution of dopants may vary throughout each of the doped contact portions 110a, the doped liner portions 106a, the doped ILD portions 96a, and the doped CESL portions 94a. A distribution of the dopants in the doped contact portions 110a, the doped liner portions 106a, the doped ILD portions 96a, and the doped CESL portions 94a is depicted as the curve 109 illustrated in FIGS. 19B and 19D. In some embodiments, a peak of the distribution curve 109 can be near the middle of the doped contact portions 110a, the doped liner portions 106a, the doped ILD portions 96a, and the doped CESL portions 94a in a direction perpendicular to a major surface of the substrate 50, but the disclosure is not limited thereto. In some embodiments, the peak of the distribution curve 109 may be near top surfaces of the doped contact portions 110a, the doped liner portions 106a, the doped ILD portions 96a, and the doped CESL portions 94a.

FIGS. 19E and 19F illustrate stress applied to the doped contact portions 110a by the doped liner portions 106a, the doped ILD portions 96a, and the doped CESL portions 94a, in accordance with some embodiments. In the embodiment illustrated in FIG. 19E, the first contact material 108 (not separately illustrated), the second contact material 110 (not separately illustrated), and the doped contact portions 110a may have rectangular shapes in a top-down view. The stress $S_{x1}$ applied to the doped contact portions 110a in a first direction may be proportional to a width $b_1$ of the doped contact portions 110a in the first direction and the stress $S_{y1}$ applied to the doped contact portions 110a in a second direction perpendicular to the first direction may be proportional to a width $a_1$ of the doped contact portions 110a in the second direction. The stress $S_{x1}$ and the stress $S_{y1}$ may also depend on the materials of the CESL 94 and the first ILD 96. The width $a_1$ and the width $b_1$ may range from about 5 nm to about 200 nm and a ratio of the width $a_1$ to the width $b_1$ may range from about 1 to about 40. In embodiments in which the CESL 94 and the first ILD 96 are formed of the same materials (e.g., silicon oxide, silicon nitride, or the like), the stress $S_{x1}$ and the stress $S_{y1}$ may be equal when the width $a_1$ and the width $b_1$ are equal, the stress $S_{x1}$ may be greater than the stress $S_{y1}$ when $a_1$ is less than $b_1$, and the stress $S_{x1}$ may be less than the stress $S_{y1}$ when $a_1$ is greater than $b_1$. In embodiments in which the CESL 94 and the first ILD 96 are formed of different materials, the stress $S_{x1}$ and the stress $S_{y1}$ may be equal when either of the widths $a_1$ or $b_1$ are greater and either of the stress $S_{x1}$ or the stress $S_{y1}$ may be greater when the widths $a_1$ and $b_1$ are equal or when either of the widths $a_1$ or $b_1$ are greater.

In the embodiment illustrated in FIG. 19F, the first contact material 108 (not separately illustrated), the second contact material 110 (not separately illustrated), and the doped contact portions 110a may have round shapes (e.g., elliptical shapes) in a top-down view. The stress $S_{x2}$ applied to the doped contact portions 110a in a first direction may be proportional to a width $b_2$ of the doped contact portions 110a in the first direction and the stress $S_{y2}$ applied to the doped contact portions 110a in a second direction perpendicular to the first direction may be proportional to a width $a_2$ of the doped contact portions 110a in the second direction. The stress $S_2$ and the stress $S_{y2}$ may also depend on the materials of the CESL 94 and the first ILD 96. The width $a_2$ and the width $b_2$ may range from about 5 nm to about 200 nm and a ratio of the width $a_2$ to the width $b_2$ may range from about 1 to about 40. In embodiments in which the CESL 94 and the first ILD 96 are formed of the same materials (e.g., silicon oxide, silicon nitride, or the like), the stress $S_{x2}$ and the stress $S_{y2}$ may be equal when the width $a_2$ and the width $b_2$ are equal, the stress $S_{x2}$ may be greater than the stress $S_{y2}$ when $a_2$ is less than $b_2$, and the stress $S_2$ may be less than the stress $S_{y2}$ when $a_2$ is greater than $b_2$. In embodiments in which the CESL 94 and the first ILD 96 are formed of different materials, the stress $S_2$ and the stress $S_{y2}$ may be equal when either of the widths $a_2$ or $b_2$ are greater and either of the stress $S_{x2}$ or the stress $S_{y2}$ may be greater when the widths $a_2$ and $b_2$ are equal or when either of the widths $a_2$ or $b_2$ are greater.

Although the dopants have been described as only being implanted in the second contact material 110, the liner 106, the first ILD 96, and the CESL 94, in some embodiments, the dopants may also be implanted in the first spacers 81, the second spacers 83, the gate dielectric layers 100, and the gate electrodes 102. Implanting the dopants in any of the first spacers 81, the second spacers 83, the gate dielectric layers 100, and the gate electrodes 102 may cause additional stress to be applied to the doped contact portions 110a, which may improve sealing between the doped contact portions 110a and the doped liner portions 106a. Moreover, in some embodiments, the dopants may be implanted throughout the thickness of the second contact material 110 and into the first contact material 108.

In FIGS. 20A through 20D, a planarization process, such as a CMP, may be performed to level top surfaces of the doped contact portions 110a with top surfaces of the doped liner portions 106a, the doped ILD portions 96a, the doped CESL portions 94a, the first spacers 81, the second spacers 83, the gate dielectric layers 100, and the gate electrodes 102. The planarization process may use process fluids, such as a CMP slurry and the like, which may remove materials of the first contact material 108, the second contact material 110, and the doped contact portions 110a when the process fluids come into contact with the first contact material 108, the second contact material 110, and the doped contact portions 110a. Performing the ion implant process to form the doped contact portions 110a, the doped liner portions 106a, the doped ILD portions 96a, and the doped CESL portions 94a improves sealing between the doped contact portions 110a and the doped liner portions 106a, which prevents the process fluids from penetration between the doped liner portions 106a and each of the doped contact portions 110a, the second contact material 110, and the first contact material 108. This prevents undesired removal of material from the doped contact portions 110a, the second contact material 110, and the first contact material 108, reduces device defects, and improves device performance.

Following the planarization, a peak of the distribution of the dopants in the doped contact portions 110a, the doped liner portions 106a, the doped ILD portions 96a, and the doped CESL portions 94a can be near the middle of the doped contact portions 110a, the doped liner portions 106a, the doped ILD portions 96a, and the doped CESL portions 94a in a direction perpendicular to a major surface of the substrate 50. In some embodiments, the peak of the distribution of the dopants in the doped contact portions 110a, the doped liner portions 106a, the doped ILD portions 96a, and the doped CESL portions 94a may be near top surfaces of the doped contact portions 110a, the doped liner portions 106a, the doped ILD portions 96a, and the doped CESL portions 94a.

Figure 21B:
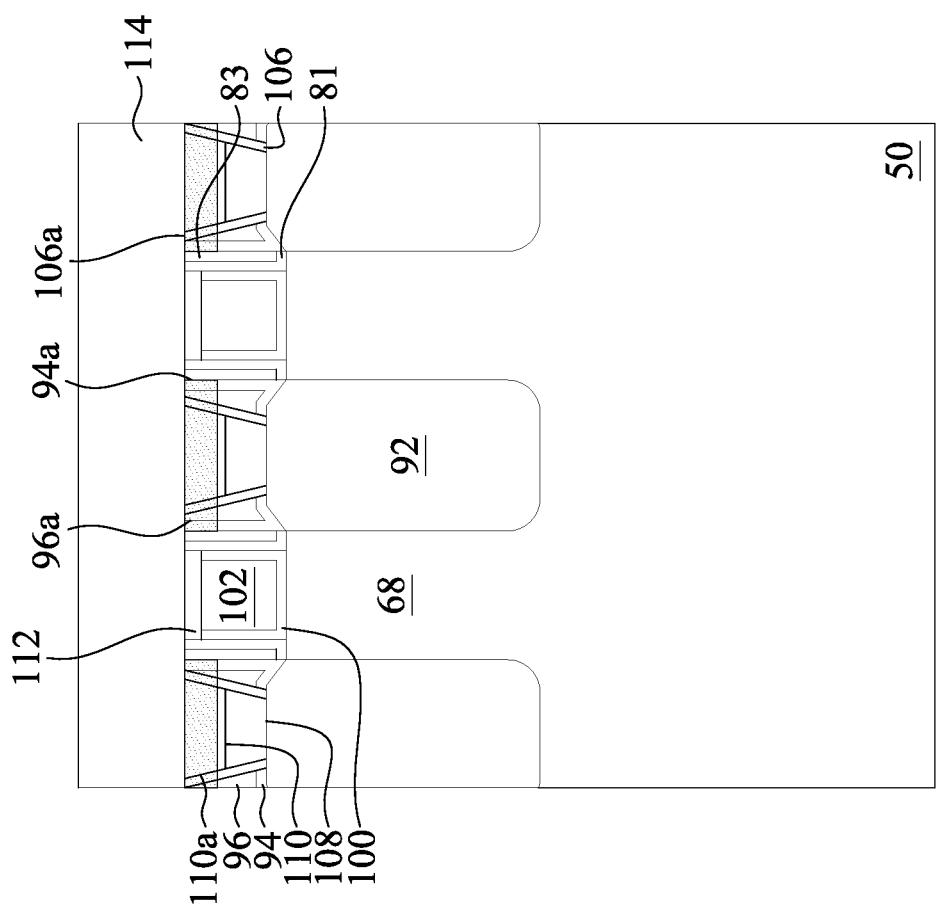
Figure 21A:
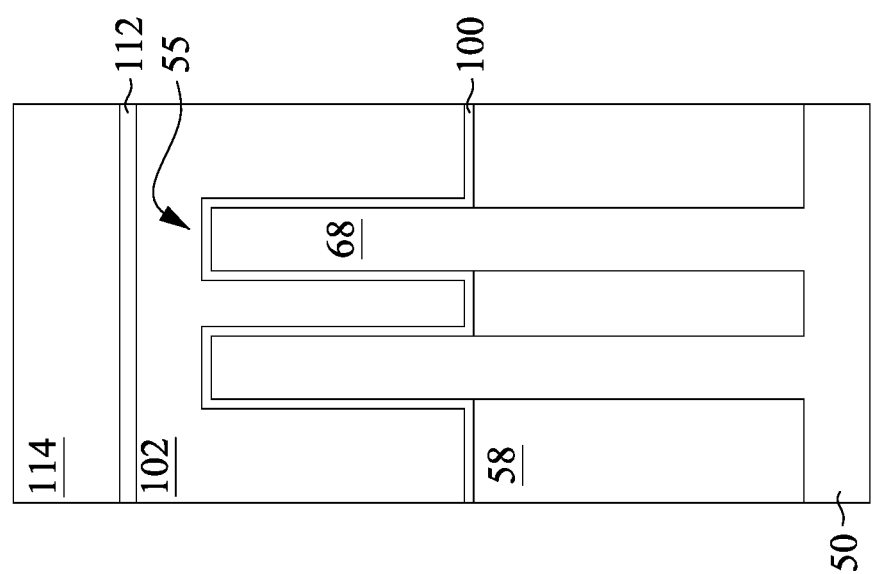

In FIGS. 21A and 21B, a second ILD 114 is deposited over the doped contact portions 110a, the doped liner portions 106a, the doped ILD portions 96a, the doped CESL portions 94a, the first spacers 81, the second spacers 83, the gate dielectric layers 100, and the gate electrodes 102. In some embodiments, the second ILD 114 is a flowable film formed by FCVD. In some embodiments, the second ILD 114 is formed of a dielectric material such as PSG, BSG, BPSG, USG, or the like, and may be deposited by any suitable method, such as CVD, PECVD, or the like. In some embodiments, the dielectric materials for the second ILD 114 may include silicon oxide, silicon nitride, silicon oxynitride, or the like. In some embodiments, before the formation of the second ILD 114, the gate stack (including the gate dielectric layers 100 and the corresponding overlying gate electrodes 102) is recessed, so that a recess is formed directly over the gate stack and between opposing portions of first spacers 81. A gate mask 112 comprising one or more layers of dielectric material, such as silicon nitride, silicon oxynitride, or the like, is filled in the recess, followed by a planarization process to remove excess portions of the dielectric material extending over the doped contact portions 110a, the doped liner portions 106a, the doped ILD portions 96a, the doped CESL portions 94a, the first spacers 81, and the second spacers 83. Subsequently formed gate contacts (such as the gate contacts 116, discussed below with respect to FIGS. 22A and 22B) penetrate through the gate mask 112 to contact the top surface of the recessed gate electrodes 102.

Figure 22B:
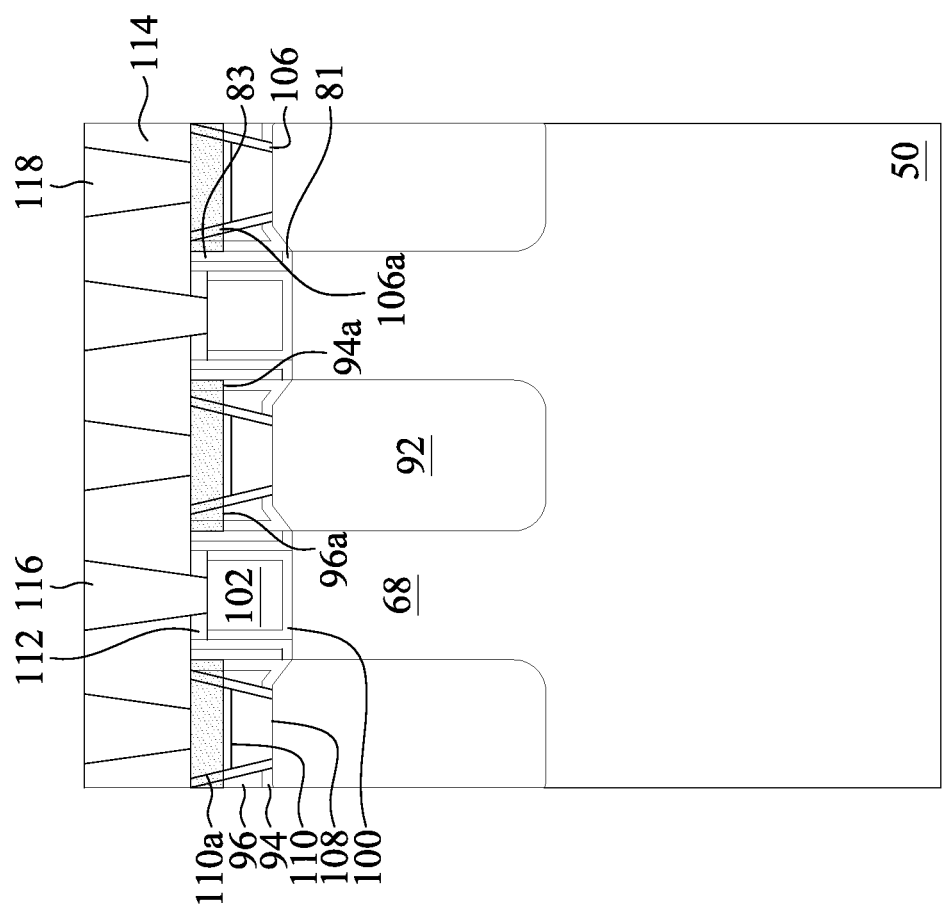
Figure 22A:
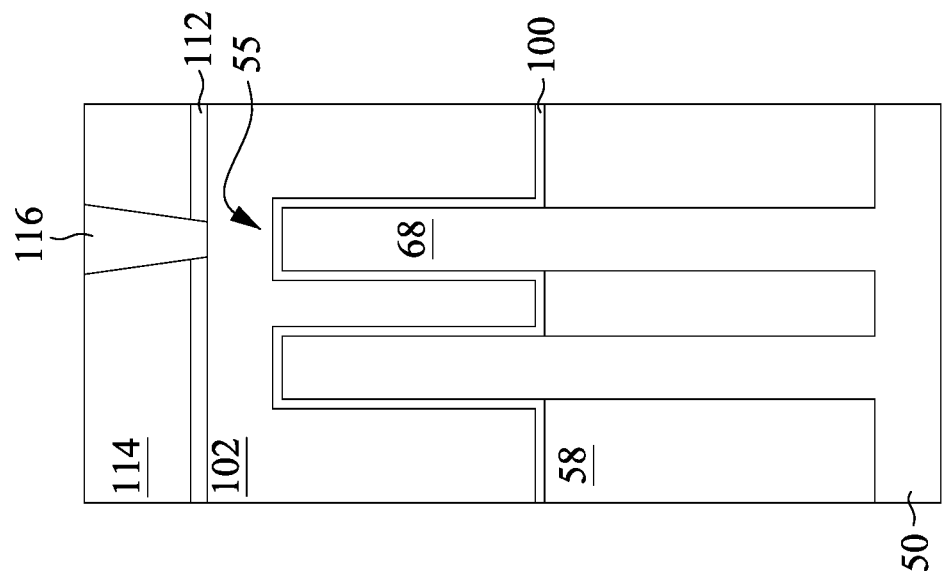

In FIGS. 22A and 22B, gate contacts 116 are formed through the second ILD 114 and the gate masks 112 and source/drain contacts 118 are formed through the second ILD 114. Openings for the source/drain contacts 118 are formed through the second ILD 114 and openings for the gate contacts 116 are formed through the second ILD 114 and the gate mask 112. The openings may be formed using acceptable photolithography and etching techniques. A liner, such as a diffusion barrier layer, an adhesion layer, or the like, and a conductive material are formed in the openings. The liner may include titanium, titanium nitride, tantalum, tantalum nitride, or the like. The conductive material may be copper, a copper alloy, silver, gold, tungsten, cobalt, aluminum, nickel, or the like. A planarization process, such as a CMP, may be performed to remove excess material from a surface of the second ILD 114. The remaining liner and conductive material form the source/drain contacts 118 and the gate contacts 116 in the openings. The source/drain contacts 118 are physically and electrically coupled to the epitaxial source/drain regions 92 through the first contact material 108, the second contact material, and the doped contact portions 110a, and the gate contacts 116 are physically and electrically coupled to the gate electrodes 102. The source/drain contacts 118 and the gate contacts 116 may be formed in different processes, or may be formed in the same process. Although shown as being formed in the same cross-sections, it should be appreciated that each of the source/drain contacts 118 and the gate contacts 116 may be formed in different cross-sections, which may avoid shorting of the contacts.

Embodiments may achieve various advantages. For example, doping the liner 106, the first ILD 96, and the CESL 94 to form the doped liner portions 106a, the doped ILD portions 96a, and the doped CESL portions 94a, respectively, may cause materials of the liner 106, the first ILD 96, and the CESL 94 to expand, improving sealing between the doped contact portions 110a the doped liner portions 106a. The improved sealing between doped liner portions 106a and the doped contact portions 110a prevents process fluids, such as a CMP slurry, from penetrating between the doped liner portions 106a and the doped contact portions 110a. This prevents materials of the doped contact portions 110a, the second contact material 110, and the first contact material 108 from being undesirably removed by the process fluids or the like, which reduces device defects and improves device performance.

The disclosed FinFET embodiments could also be applied to nanostructure devices such as nanostructure (e.g., nanosheet, nanowire, gate-all-around, or the like) field effect transistors (NSFETs). In an NSFET embodiment, the fins are replaced by nanostructures formed by patterning a stack of alternating layers of channel layers and sacrificial layers. Dummy gate stacks and source/drain regions are formed in a manner similar to the above-described embodiments. After the dummy gate stacks are removed, the sacrificial layers can be partially or fully removed in channel regions. The replacement gate structures are formed in a manner similar to the above-described embodiments, the replacement gate structures may partially or completely fill openings left by removing the sacrificial layers, and the replacement gate structures may partially or completely surround the channel layers in the channel regions of the NSFET devices. ILDs and contacts to the replacement gate structures and the source/drain regions may be formed in a manner similar to the above-described embodiments. A nanostructure device can be formed as disclosed in U.S. Patent Application Publication No. 2016/0365414, which is incorporated herein by reference in its entirety.

In accordance with an embodiment, a semiconductor device includes a first dielectric layer over a conductive feature, a first portion of the first dielectric layer including a first dopant; a metal feature electrically coupled to the conductive feature, the metal feature including a first contact material in contact with the conductive feature; a second contact material over the first contact material, the second contact material including a material different from the first contact material, a first portion of the second contact material further including the first dopant; and a dielectric liner between the first dielectric layer and the metal feature, a first portion of the dielectric liner including the first dopant. In an embodiment, the first dopant includes germanium (Ge). In an embodiment, the first contact material includes cobalt (Co) and the second contact material includes tungsten (W). In an embodiment, the first portion of the first dielectric layer, the first portion of the second contact material, and the first portion of the dielectric liner each extend to depths ranging from 1 nm to 15 nm. In an embodiment, top surfaces of the first dielectric layer, the metal feature, and the dielectric liner are level with one another. In an embodiment, the semiconductor device further includes a second dielectric layer over the conductive feature, a first portion of the second dielectric layer is doped with the first dopant, the first dielectric layer and the second dielectric layer each contact sidewalls of the dielectric liner, and the first dielectric layer and the second dielectric layer each include different materials. In an embodiment, the first dielectric layer includes silicon oxide and the second dielectric layer includes silicon nitride. In an embodiment, a maximum concentration of the first dopant in each of the first portion of the first dielectric layer, the first portion of the second contact material, and the first portion of the dielectric liner is at a top surface of the first portion of the first dielectric layer, the first portion of the second contact material, and the first portion of the dielectric liner, respectively. In an embodiment, a maximum concentration of the first dopant in each of the first portion of the first dielectric layer, the first portion of the second contact material, and the first portion of the first dielectric layer is below a top surface of the first portion of the first dielectric layer, the first portion of the second contact material, and the first portion of the first dielectric layer, respectively.

In accordance with another embodiment, a semiconductor device includes a first dielectric layer over a substrate and a conductive feature; a first doped dielectric layer over the first dielectric layer; a first metal portion in the first dielectric layer and electrically coupled to the conductive feature; a doped metal portion over the first metal portion, the first metal portion and the doped metal portion including a same metal material; a dielectric liner between the first dielectric layer and the first metal portion; and a doped liner over the dielectric liner and between the first doped dielectric layer and the doped metal portion, the first doped dielectric layer, the doped liner, and the doped metal portion each including first dopants. In an embodiment, the first dopants include xenon (Xe). In an embodiment, the semiconductor device further includes a second metal portion between the first metal portion and the conductive feature, the second metal portion electrically coupling the first metal portion to the conductive feature, the second metal portion including a different metal than the first metal portion. In an embodiment, the second metal portion includes cobalt (Co) and the first metal portion includes ruthenium (Ru). In an embodiment, the dielectric liner contacts sidewalls of the first metal portion and the second metal portion, and the doped liner contacts sidewalls of the first metal portion. In an embodiment, bottom extents of the first doped dielectric layer, the doped metal portion, and the doped liner are aligned with one another.

In accordance with yet another embodiment, a method includes depositing a first dielectric layer over a conductive feature; etching the first dielectric layer to form an opening exposing the conductive feature; forming a dielectric liner in the opening, the dielectric liner lining sidewalls of the first dielectric layer; forming a first metal portion in the opening over the conductive feature; forming a second metal portion over the first metal portion and filling the opening, the second metal portion including a material different from the first metal portion; and performing an ion implantation on the first dielectric layer, the dielectric liner, and the second metal portion, the ion implantation causing the material of the first dielectric layer and the dielectric liner to expand in a direction towards the second metal portion. In an embodiment, forming the first metal portion includes depositing a first metal material in the opening; and etching back the first metal material, the first metal material including cobalt. In an embodiment, the ion implantation is performed at a temperature from −100° C. to 25° C. In an embodiment, the ion implantation is performed with germanium dopants at a dosage from $1×10^{14}$ atoms/cm$^2$ to $1×10^{16}$ atoms/cm$^2$, and the ion implantation causes the material of the first dielectric layer and the dielectric liner to expand in the direction towards the second metal portion by at least 1 nm. In an embodiment, the method further includes planarizing the second metal portion, the dielectric liner, and the first dielectric layer after performing the ion implantation.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a first dielectric layer over a conductive feature, wherein a first portion of the first dielectric layer comprises a first dopant;
   a metal feature electrically coupled to the conductive feature, the metal feature comprising:
      a first contact material in contact with the conductive feature;
      a second contact material over the first contact material, the second contact material comprising a material different from the first contact material, wherein a first portion of the second contact material further comprises the first dopant; and
   a dielectric liner between the first dielectric layer and the metal feature, wherein a first portion of the dielectric liner comprises the first dopant.

2. The semiconductor device of claim 1, wherein the first dopant comprises germanium.

3. The semiconductor device of claim 1, wherein the first contact material comprises cobalt (Co) and the second contact material comprises tungsten.

4. The semiconductor device of claim 1, wherein the first portion of the first dielectric layer, the first portion of the second contact material, and the first portion of the dielectric liner each extend to depths ranging from 1 nm to 15 nm.

5. The semiconductor device of claim 1, wherein top surfaces of the first dielectric layer, the metal feature, and the dielectric liner are level with one another.

6. The semiconductor device of claim 1, further comprising a second dielectric layer over the conductive feature, wherein a first portion of the second dielectric layer is doped with the first dopant, wherein the first dielectric layer and the second dielectric layer each contact sidewalls of the dielectric liner, and wherein the first dielectric layer and the second dielectric layer each comprise different materials.

7. The semiconductor device of claim 6, wherein the first dielectric layer comprises silicon oxide and the second dielectric layer comprises silicon nitride.

8. The semiconductor device of claim 1, wherein a maximum concentration of the first dopant in each of the first portion of the first dielectric layer, the first portion of the second contact material, and the first portion of the dielectric liner is at a top surface of the first portion of the first dielectric layer, the first portion of the second contact material, and the first portion of the dielectric liner, respectively.

9. The semiconductor device of claim 1, wherein a maximum concentration of the first dopant in each of the first portion of the first dielectric layer, the first portion of the second contact material, and the first portion of the first dielectric layer is below a top surface of the first portion of the first dielectric layer, the first portion of the second contact material, and the first portion of the first dielectric layer, respectively.

10. A semiconductor device comprising:
    a first dielectric layer over a substrate and a conductive feature;
    a first doped dielectric layer over the first dielectric layer;
    a first metal portion;
    a second metal portion in the first dielectric layer and electrically coupled to the conductive feature, wherein the first metal portion is between the second metal portion and the conductive feature, the first metal portion electrically coupling the second metal portion to the conductive feature, the second metal portion comprising a different metal than the first metal portion;
    a doped metal portion over the second metal portion, wherein the second metal portion and the doped metal portion comprise a same metal material;
    a dielectric liner between the first dielectric layer and the second metal portion; and
    a doped liner over the dielectric liner and between the first doped dielectric layer and the doped metal portion, wherein the first doped dielectric layer, the doped liner, and the doped metal portion each comprise first dopants.

11. The semiconductor device of claim 10, wherein the first dopants comprise xenon.

12. The semiconductor device of claim 10, wherein the first metal portion comprises cobalt.

13. The semiconductor device of claim 10, wherein the dielectric liner contacts sidewalls of the first metal portion and the second metal portion, and wherein the doped liner contacts sidewalls of the second metal portion.

14. The semiconductor device of claim 10, wherein bottom extents of the first doped dielectric layer, the doped metal portion, and the doped liner are aligned with one another.

15. The semiconductor device of claim 10, wherein a thickness of the second metal portion is non-uniform.

16. A semiconductor device, comprising:
    a first dielectric layer over a conductive feature; and
    a contact structure extending through the first dielectric layer to the conductive feature, the contact structure comprising:
       a dielectric liner adjacent sidewalls of the first dielectric layer, the dielectric liner comprising a doped liner portion and an undoped liner portion;
       a first metal portion over the conductive feature, the dielectric liner being between the first dielectric layer and the first metal portion; and
       a second metal portion over the first metal portion, the second metal portion comprising a material different from the first metal portion, the second metal portion comprises a doped second metal portion and an undoped second metal portion, the doped second metal portion comprising a first dopant, the undoped second metal portion being between the doped second metal portion and the first metal portion, the dielectric liner being between the first dielectric layer and the second metal portion.

17. The semiconductor device of claim 16, wherein a thickness of the doped second metal portion is in a range between 1 nm and 15 nm.

18. The semiconductor device of claim 16, wherein the first dopant comprises germanium.

19. The semiconductor device of claim 16, further comprising a second dielectric layer over the conductive feature, wherein a first portion of the second dielectric layer is doped with the first dopant, wherein the first dielectric layer and the second dielectric layer each contact sidewalls of the dielectric liner.

20. The semiconductor device of claim 16, wherein a bottom of the doped liner portion is above a top of the first metal portion.

* * * * *